US008983785B2

(12) United States Patent
Panko

(10) Patent No.: US 8,983,785 B2
(45) Date of Patent: Mar. 17, 2015

(54) SYSTEM AND METHOD FOR SIMULTANEOUS DISPLAY OF WAVEFORMS GENERATED FROM INPUT SIGNALS RECEIVED AT A DATA ACQUISITION DEVICE

(75) Inventor: James A. Panko, Wonder Lake, IL (US)

(73) Assignee: Snap-on Incorporated, Kenosha, WI (US)

( * ) Notice: Subject to any disclaimer, the term of this patent is extended or adjusted under 35 U.S.C. 154(b) by 748 days.

(21) Appl. No.: 13/198,530

(22) Filed: Aug. 4, 2011

(65) Prior Publication Data

US 2012/0046897 A1 Feb. 23, 2012

Related U.S. Application Data

(60) Provisional application No. 61/374,845, filed on Aug. 18, 2010.

(51) Int. Cl.
*G01D 7/08* (2006.01)
*G01R 13/02* (2006.01)
(Continued)

(52) U.S. Cl.
CPC .............. *G01R 13/029* (2013.01); *G06F 19/00* (2013.01); *G01R 15/12* (2013.01); *G01D 7/08* (2013.01);
(Continued)

(58) Field of Classification Search
CPC ........... G01D 7/00; G01D 7/005; G01D 7/02; G01D 7/08; G01D 9/00; G01D 9/28; G01D 9/32; G01D 21/00; G01D 21/02; G01R 13/00; G01R 13/02; G01R 13/029; G01R 13/0218; G01R 13/0227; G01R 13/0236; G01R 13/20; G01R 13/22; G01R 13/28; G01R 15/00; G01R 15/12; G01R 15/125; G01R 19/00; G01R 19/25; G01R 19/2506; G01R 19/2509; G06F 11/00; G06F 11/30; G06F 11/32; G06F 11/34; G06F 17/00; G06F 17/40; G06F 19/00; G06F 15/00; G06F 15/16; G06F 17/10; G07C 5/00; G07C 5/08; G07C 5/0808; G07C 2205/00; G07C 2205/02

USPC .......................... 73/432.1, 865.8, 865.9, 866.3; 324/76.11, 113, 121 R, 500, 503; 340/146.2, 500, 540, 635, 657, 815.4, 340/815.65; 345/418, 581, 586, 619, 629; 346/45, 46, 65, 66; 702/1, 57, 66, 67, 702/68, 71, 73, 127, 182, 187, 188, 189; 708/100, 105, 200; 715/700, 764, 771, 715/866

See application file for complete search history.

(56) References Cited

U.S. PATENT DOCUMENTS 2,587,079 A * 2/1952 Woods et al. .................... 346/66
2,680,210 A * 6/1954 Miller et al. ................... 315/392

(Continued)

FOREIGN PATENT DOCUMENTS

CA       2373157 A1    3/2000
DE    195 43 784 A1    5/2007

(Continued)

OTHER PUBLICATIONS

Zussman, Gil et al, Bluetooth Time Division Duplex Analysis as a Polling System, Aug. 19, 2004.

(Continued)

*Primary Examiner* — Edward Cosimano
(74) *Attorney, Agent, or Firm* — McDonnell Boehnen Hulbert & Berghoff LLP

(57) ABSTRACT

A method and system for displaying waveforms generated from input signals received at a common input channel (CIC) of a data acquisition (DAQ) device. An input signal received at the CIC can be displayed as a present-time waveform, and while the input signal is displayed as a present-time waveform, the input signal can be tagged for displaying the input signal as a historical waveform for the CIC. After receiving another input signal at the CIC, a display can be refreshed to display, simultaneously, the historical waveform for the CIC and the other input signal as another present-time waveform for the CIC. The DAQ device can tag the displayed input signal in response to a user pushing a selector device on the DAQ device. The display can display other present-time waveforms with the historical waveform to allow a user to compare input signals received at the CIC.

23 Claims, 9 Drawing Sheets

(51) Int. Cl.
*G01R 15/12* (2006.01)
*G06F 17/40* (2006.01)
*G06F 19/00* (2011.01)
*G07C 5/08* (2006.01)

(52) U.S. Cl.
CPC ............ *G06F 17/40* (2013.01); *G01R 13/0236* (2013.01); *G01R 15/125* (2013.01); *G07C 5/0808* (2013.01); *G07C 2205/02* (2013.01)
USPC ............ 702/67; 73/866.3; 324/113; 340/657; 340/815.65; 345/629; 702/1; 702/127; 702/182; 702/187; 702/189

(56) References Cited

U.S. PATENT DOCUMENTS

| | | | |
|---|---|---|---|
| 4,058,826 A * | 11/1977 | Schneider | 348/184 |
| 4,072,851 A * | 2/1978 | Rose | 702/68 |
| 4,104,725 A * | 8/1978 | Rose et al. | 702/68 |
| 4,113,980 A | 9/1978 | Bell | |
| 4,257,104 A * | 3/1981 | Martin et al. | 702/68 |
| 4,270,174 A | 5/1981 | Karlin et al. | |
| 4,404,639 A | 9/1983 | McQuire et al. | |
| 4,441,359 A | 4/1984 | Ezoe | |
| 4,602,127 A | 7/1986 | Neely et al. | |
| 4,774,438 A * | 9/1988 | Rogers et al. | 315/392 |
| 4,814,896 A | 3/1989 | Heitzman et al. | |
| 4,853,850 A | 8/1989 | Krass, Jr. et al. | |
| 4,962,456 A | 10/1990 | Abe et al. | |
| 5,157,610 A | 10/1992 | Asano et al. | |
| 5,160,892 A | 11/1992 | Makhija et al. | |
| 5,317,304 A | 5/1994 | Choi | |
| 5,365,436 A | 11/1994 | Schaller et al. | |
| 5,373,458 A | 12/1994 | Bishay et al. | |
| 5,396,168 A | 3/1995 | Heep et al. | |
| 5,417,222 A | 5/1995 | Dempsey et al. | |
| 5,432,904 A | 7/1995 | Wong | |
| 5,442,553 A | 8/1995 | Parrillo | |
| 5,465,207 A | 11/1995 | Boatwright et al. | |
| 5,506,772 A | 4/1996 | Kubozono et al. | |
| 5,507,288 A | 4/1996 | Bocker et al. | |
| 5,521,443 A | 5/1996 | Imura et al. | |
| 5,532,927 A | 7/1996 | Pink et al. | |
| 5,541,840 A | 7/1996 | Gurne et al. | |
| 5,583,912 A | 12/1996 | Schillaci et al. | |
| 5,592,383 A | 1/1997 | Rogers et al. | |
| 5,687,717 A | 11/1997 | Halpern et al. | |
| 5,758,300 A | 5/1998 | Abe | |
| 5,766,020 A | 6/1998 | Hughes | |
| 5,836,666 A | 11/1998 | Aoyama et al. | |
| 5,850,209 A | 12/1998 | Lemke et al. | |
| 5,884,202 A | 3/1999 | Arjomand | |
| 5,899,947 A | 5/1999 | Hall et al. | |
| 5,923,161 A * | 7/1999 | Frankovitch et al. | 324/115 |
| 6,021,366 A | 2/2000 | Fieramosca et al. | |
| 6,055,468 A | 4/2000 | Kaman et al. | |
| 6,067,486 A | 5/2000 | Aragones et al. | |
| 6,094,609 A | 7/2000 | Arjomand | |
| 6,134,489 A | 10/2000 | Smedley | |
| 6,140,811 A | 10/2000 | Little | |
| 6,169,943 B1 | 1/2001 | Simon et al. | |
| 6,178,527 B1 | 1/2001 | Vidales | |
| 6,179,214 B1 | 1/2001 | Key et al. | |
| 6,181,563 B1 | 1/2001 | Shimbo et al. | |
| 6,188,384 B1 | 2/2001 | Sullivan et al. | |
| 6,192,303 B1 | 2/2001 | Takakura et al. | |
| 6,195,617 B1 * | 2/2001 | Miller | 702/125 |
| 6,222,374 B1 | 4/2001 | Shoemaker | |
| 6,294,982 B1 | 9/2001 | Hooks et al. | |
| 6,311,138 B2 * | 10/2001 | Miller | 702/67 |
| 6,314,422 B1 | 11/2001 | Barker et al. | |
| 6,321,151 B1 | 11/2001 | Shultz | |
| 6,356,823 B1 | 3/2002 | Iannotti et al. | |
| 6,360,551 B1 | 3/2002 | Renders | |
| 6,374,315 B1 | 4/2002 | Okada et al. | |
| 6,385,300 B1 | 5/2002 | Mohammadian et al. | |
| 6,401,049 B1 | 6/2002 | Ehmer | |
| 6,416,471 B1 | 7/2002 | Kumar et al. | |
| 6,477,478 B1 | 11/2002 | Jones et al. | |
| 6,487,478 B1 | 11/2002 | Azzaro et al. | |
| 6,609,050 B2 | 8/2003 | Li | |
| 6,622,070 B1 | 9/2003 | Wacker et al. | |
| 6,640,166 B2 | 10/2003 | Liebl et al. | |
| 6,662,123 B2 | 12/2003 | Maeckel et al. | |
| 6,693,367 B1 | 2/2004 | Schmeisser et al. | |
| 6,711,524 B2 | 3/2004 | Wolf et al. | |
| 6,745,151 B2 | 6/2004 | Marko et al. | |
| 6,748,335 B2 * | 6/2004 | Pickerd | 702/66 |
| 6,757,521 B1 | 6/2004 | Ying | |
| 6,778,931 B1 | 8/2004 | Letts et al. | |
| 6,789,007 B2 | 9/2004 | Ellis et al. | |
| 6,802,032 B1 | 10/2004 | Budinger et al. | |
| 6,807,469 B2 | 10/2004 | Funkhouser et al. | |
| 6,807,496 B2 * | 10/2004 | Pickerd | 702/67 |
| 6,822,639 B1 | 11/2004 | Silverbrook et al. | |
| 6,823,243 B2 | 11/2004 | Chinnadurai et al. | |
| 6,844,823 B2 | 1/2005 | Hooks et al. | |
| 6,847,916 B1 | 1/2005 | Ying | |
| 6,873,940 B1 | 3/2005 | Kamatani | |
| 6,947,043 B1 | 9/2005 | Klingman et al. | |
| 6,957,128 B1 | 10/2005 | Ito et al. | |
| 6,959,235 B1 | 10/2005 | Abdel-Malek et al. | |
| 6,972,669 B2 | 12/2005 | Saito et al. | |
| 6,982,653 B2 | 1/2006 | Voeller et al. | |
| 6,988,053 B2 | 1/2006 | Namaky | |
| 7,020,546 B2 | 3/2006 | Nagai et al. | |
| 7,023,332 B2 | 4/2006 | Saito et al. | |
| 7,073,714 B2 | 7/2006 | Namaky et al. | |
| 7,124,058 B2 | 10/2006 | Namaky et al. | |
| 7,155,321 B2 | 12/2006 | Bromley et al. | |
| 7,200,483 B1 | 4/2007 | Kavadeles | |
| 7,224,262 B2 | 5/2007 | Simon et al. | |
| 7,251,552 B2 | 7/2007 | Schmeisser et al. | |
| 7,254,550 B2 | 8/2007 | Reichwein et al. | |
| 7,269,482 B1 | 9/2007 | Shultz et al. | |
| 7,272,476 B2 | 9/2007 | Ortiz et al. | |
| 7,281,663 B2 | 10/2007 | Schmidt et al. | |
| 7,294,906 B2 | 11/2007 | Ukaji | |
| 7,327,228 B2 | 2/2008 | Min et al. | |
| 7,336,082 B1 | 2/2008 | Mofield | |
| 7,350,159 B2 | 3/2008 | Cancilla et al. | |
| 7,363,129 B1 | 4/2008 | Barnicle et al. | |
| 7,383,318 B2 | 6/2008 | Craik | |
| 7,444,216 B2 | 10/2008 | Rogers et al. | |
| 7,504,926 B2 | 3/2009 | Bessho et al. | |
| 7,530,949 B2 | 5/2009 | Al Ali et al. | |
| 7,535,466 B2 | 5/2009 | Sampsell et al. | |
| 7,580,781 B2 | 8/2009 | Mindeman | |
| 7,613,554 B2 | 11/2009 | Rollinger et al. | |
| 7,634,337 B2 | 12/2009 | Brozovich et al. | |
| 7,648,062 B2 | 1/2010 | Corniot | |
| 7,702,437 B2 | 4/2010 | Gilbert | |
| 7,711,462 B2 | 5/2010 | Daniels et al. | |
| 7,737,860 B2 | 6/2010 | Banta et al. | |
| 7,751,955 B2 | 7/2010 | Chinnadurai et al. | |
| 8,019,503 B2 | 9/2011 | Andreasen et al. | |
| 8,095,261 B2 | 1/2012 | Howell et al. | |
| 8,370,018 B2 | 2/2013 | Andreasen et al. | |
| 8,412,401 B2 | 4/2013 | Bertosa et al. | |
| 8,463,953 B2 | 6/2013 | Davis et al. | |
| 8,670,437 B2 | 3/2014 | Walker et al. | |
| 2001/0001850 A1 * | 5/2001 | Miller | 702/67 |
| 2002/0007237 A1 | 1/2002 | Phung et al. | |
| 2002/0040261 A1 | 4/2002 | Nakamoto et al. | |
| 2002/0077780 A1 | 6/2002 | Liebl et al. | |
| 2003/0020759 A1 | 1/2003 | Cancilla et al. | |
| 2003/0034721 A1 | 2/2003 | Lipscomb et al. | |
| 2003/0036832 A1 | 2/2003 | Kokes et al. | |
| 2003/0058243 A1 | 3/2003 | Faust et al. | |
| 2003/0088346 A1 | 5/2003 | Calkins et al. | |
| 2003/0122671 A1 | 7/2003 | Jespersen | |
| 2003/0208328 A1 * | 11/2003 | Pickerd | 702/67 |
| 2003/0208330 A1 * | 11/2003 | Pickerd | 702/80 |
| 2003/0222873 A1 | 12/2003 | Ritter | |

(56) References Cited

U.S. PATENT DOCUMENTS

| | | |
|---|---|---|
| 2004/0054503 A1 | 3/2004 | Namaky |
| 2004/0172177 A1 | 9/2004 | Nagai et al. |
| 2005/0083965 A1 | 4/2005 | Sodergren |
| 2005/0094588 A1 | 5/2005 | Wentink |
| 2005/0152294 A1 | 7/2005 | Yu et al. |
| 2005/0157732 A1 | 7/2005 | Joy et al. |
| 2005/0182537 A1 | 8/2005 | Tefft et al. |
| 2005/0267655 A1 | 12/2005 | Gessner |
| 2006/0025897 A1 | 2/2006 | Shostak et al. |
| 2006/0036355 A1 | 2/2006 | Schaar et al. |
| 2006/0062190 A1 | 3/2006 | Suga |
| 2006/0066504 A1 | 3/2006 | Sampsell et al. |
| 2006/0078175 A1 | 4/2006 | Brozovich |
| 2006/0095230 A1 | 5/2006 | Grier et al. |
| 2006/0101311 A1 | 5/2006 | Lipscomb et al. |
| 2006/0106508 A1 | 5/2006 | Liebl et al. |
| 2006/0149434 A1 | 7/2006 | Bertosa et al. |
| 2006/0180371 A1 | 8/2006 | Breed et al. |
| 2006/0199537 A1 | 9/2006 | Eisenbach |
| 2006/0212239 A1 | 9/2006 | Letts et al. |
| 2006/0212540 A1 | 9/2006 | Chon et al. |
| 2006/0226298 A1 | 10/2006 | Pierson |
| 2007/0010922 A1 | 1/2007 | Buckley |
| 2007/0043488 A1 | 2/2007 | Avery et al. |
| 2007/0072154 A1 | 3/2007 | Akatsuka et al. |
| 2007/0073459 A1 | 3/2007 | Webster et al. |
| 2007/0073460 A1 | 3/2007 | Bertosa et al. |
| 2007/0083307 A1 | 4/2007 | Pasztor et al. |
| 2007/0100520 A1 | 5/2007 | Shah et al. |
| 2007/0146133 A1 | 6/2007 | Wehrenberg |
| 2007/0156311 A1 | 7/2007 | Elcock et al. |
| 2007/0156313 A1 | 7/2007 | Fudali et al. |
| 2007/0200550 A1 | 8/2007 | Corredoura |
| 2007/0244611 A1 | 10/2007 | Brozovich |
| 2007/0244614 A1 | 10/2007 | Nathanson |
| 2007/0288134 A1 | 12/2007 | Rollinger et al. |
| 2007/0290847 A1 | 12/2007 | Harrington et al. |
| 2007/0294556 A1 | 12/2007 | Wutka |
| 2008/0003997 A1 | 1/2008 | Parkkinen et al. |
| 2008/0004764 A1 | 1/2008 | Chinnadurai et al. |
| 2008/0015748 A1 | 1/2008 | Nagy |
| 2008/0033609 A1 | 2/2008 | Razavi |
| 2008/0070501 A1 | 3/2008 | Wyld |
| 2008/0076389 A1 | 3/2008 | Lee et al. |
| 2008/0082221 A1 | 4/2008 | Nagy |
| 2008/0082278 A1 | 4/2008 | Tan et al. |
| 2008/0103658 A1 | 5/2008 | Boac et al. |
| 2008/0122288 A1 | 5/2008 | Plante et al. |
| 2008/0125067 A1 | 5/2008 | Bells et al. |
| 2008/0140281 A1 | 6/2008 | Morris et al. |
| 2008/0228344 A1 | 9/2008 | Sampson et al. |
| 2008/0248748 A1 | 10/2008 | Sangster et al. |
| 2008/0271107 A1 | 10/2008 | Shioyama et al. |
| 2008/0285659 A1 | 11/2008 | Raines et al. |
| 2008/0319665 A1 | 12/2008 | Berkobin et al. |
| 2009/0125351 A1 | 5/2009 | Davis, Jr. |
| 2009/0150970 A1 | 6/2009 | Hinds et al. |
| 2009/0253410 A1 | 10/2009 | Fitzgerald et al. |
| 2009/0256690 A1 | 10/2009 | Golenski |
| 2009/0259349 A1 | 10/2009 | Golenski |
| 2009/0265057 A1 | 10/2009 | Chinnadurai et al. |
| 2009/0276115 A1 | 11/2009 | Chen |
| 2009/0288009 A1 | 11/2009 | Dulaney |
| 2009/0299539 A1 | 12/2009 | Chinnadurai et al. |
| 2009/0307188 A1 | 12/2009 | Oldham et al. |
| 2010/0042288 A1 | 2/2010 | Lipscomb et al. |
| 2010/0076644 A1 | 3/2010 | Cahill et al. |
| 2010/0100646 A1 | 4/2010 | Park |
| 2010/0128632 A1 | 5/2010 | Mantysalo |
| 2010/0205450 A1 | 8/2010 | Sarnacke et al. |
| 2010/0289872 A1 | 11/2010 | Funabiki et al. |
| 2011/0141953 A1 | 6/2011 | Wright et al. |
| 2011/0153798 A1 | 6/2011 | Groenendaal et al. |
| 2011/0313593 A1 | 12/2011 | Cohen et al. |
| 2012/0044052 A1 | 2/2012 | Davis et al. |
| 2012/0044086 A1 | 2/2012 | Ruther et al. |
| 2012/0044527 A1 | 2/2012 | Panko |
| 2012/0044607 A1 | 2/2012 | Loewe |
| 2012/0045927 A1 | 2/2012 | Panko et al. |
| 2012/0046807 A1 | 2/2012 | Ruther et al. |
| 2012/0046824 A1 | 2/2012 | Ruther et al. |
| 2012/0046825 A1 | 2/2012 | Ruther et al. |
| 2012/0046826 A1 | 2/2012 | Panko |
| 2012/0047289 A1 | 2/2012 | Krzystofczyk et al. |
| 2012/0047291 A1 | 2/2012 | Davis et al. |
| 2012/0047458 A1 | 2/2012 | Alberry et al. |
| 2012/0047499 A1 | 2/2012 | Krzystofczyk et al. |
| 2012/0139952 A1 | 6/2012 | Imai et al. |
| 2012/0215398 A1 | 8/2012 | Chen et al. |
| 2012/0242510 A1 | 9/2012 | Choi et al. |
| 2013/0295912 A1 | 11/2013 | Chen |
| 2013/0297143 A1 | 11/2013 | Chen et al. |

FOREIGN PATENT DOCUMENTS

| | | |
|---|---|---|
| DE | 20 2009 009 035 U1 | 10/2009 |
| GB | 2277807 A | 11/1994 |
| GB | 2385934 A | 9/2003 |
| GB | 2405486 A | 3/2005 |
| JP | 2008233970 A | 10/2008 |
| WO | 9956201 A1 | 11/1999 |
| WO | 00/34838 A1 | 6/2000 |
| WO | 01/59601 A1 | 8/2001 |
| WO | 0155690 A1 | 8/2001 |
| WO | 0167420 A1 | 9/2001 |
| WO | 0186576 A1 | 11/2001 |
| WO | 2005/121814 A1 | 12/2005 |
| WO | 2006008527 A2 | 1/2006 |
| WO | 2006/050454 A2 | 5/2006 |
| WO | 2006055289 A2 | 5/2006 |
| WO | 2006110786 A2 | 10/2006 |
| WO | 2007022426 A2 | 2/2007 |
| WO | 2007038983 A1 | 4/2007 |
| WO | 2007058607 A1 | 5/2007 |
| WO | 2008/043043 A2 | 4/2008 |
| WO | 2008063818 A2 | 5/2008 |
| WO | 2009/137584 A1 | 11/2009 |
| WO | 2009149007 A1 | 12/2009 |
| WO | 2010019771 A1 | 2/2010 |

OTHER PUBLICATIONS

Fluke Corporation, Digital Multimeters, downloaded from the World Wide Web at us.fluke.com/usen/products/categorydmm on Jan. 28, 2010.

Fluke Corportation, 233 True=rms Remote Display Digital Multimeter Users Manual, Sep. 2009.

Bluetooth SIG, Inc., Bluetooth Architecture—Data Transport, downloaded from the World Wide Web at bluetooth.com/KnowledgeCenter/TechnologyOverview/Pages/DataTransport.aspx on May 6, 2010.

Shigeru et al., DL7100 Signal Explorer, A High-Speed Digital Oscilloscope with Long Record Length, Yokogawa Electric Corporation, Yogogawa Technical Report English Edition, No. 30, (2000).

bluetomorrow.com, Bluetooth Pairing, downloaded from the World Wide Web at bluetomorrow.com on Apr. 30, 2010.

Snap-On Diagnostics, Snap-on Introduces VERDICT Diagnostic and Information System, Aug. 24, 2010.

Testpath, Inc., Fluke Meter Holsters, downloaded from the World Wide Web at .testpath.com/Categories/Fluke-Meter-Holsters-2220.htm on May 6, 2010.

BMW Canada, Bluetooth Pairing Instructions, Sep. 2009.

Accessory Geeks, Bluetooth Pairing Guides, downloaded from the World Wide Web at accessorygeeks.com/bluetooth-pairing-guide1.html on Apr. 30, 2010.

Quatech, Inc., Bluetooth Communication Overview, downloaded from the World Wide Web at .quatech.com/support/comm-over-bluetooth.php on May 3, 2010.

Omitec Limited, T4 Diagnostic System, downloaded from the World Wide Web at web.archive.org/web/20091119041838/http://www.omitec.com/us/products/diagnostic-testers/t4-diagnostic-system/ as archived on Nov. 19, 2009.

(56) References Cited

OTHER PUBLICATIONS

Omitec Limited, Workstations, downloaded from the World Wide Web at web.archive.org/web/20100322213801/http://www.omitec.com/us/products/workstation/ as archived on Mar. 22, 2010.
anotherurl.com Bluetooth, What is Bluetooth? downloaded from the World Wide Web at www.anotheurl.com/library/bluetooth_research.htm on May 17, 2010.verdict.
Snap-on Incorporated, EEDM604C, Multimeter, Digital, Automotive, True RMS, Auto Ranging, Hybrid Vehicles, downloaded from the World Wide Web at buy1.snapon.com/catalog/item.asp?store=snapon-store&item_ID=88136&group_ID=1367 on May 4, 2010.
Snap-on Incorporated, EEDM596DK, Multimeter, Digital, Advanced, Manual Ranging, downloaded from the World Wide Web at buy1.snapon.com/catalog/item.asp?store=snapon-store&item_ID=84657&group_ID=1367 on May 4, 2010.
Snap-on Incorporated, EEDM503D, Multimeter, Digital, Automotive, True RMS, downloaded from the World Wide Web at buy1.snapon.com/catalog/item.asp?store=snapon-store&item_ID=84656&group_ID=1367 on May 4, 2010.
Fluke, 163/164 MultiFunction Counter Users Manual, Feb. 1, 1997.
Fluke, Fluke 164 2.7 GHz Multifunction Counter Technical Data, May 10, 2007.
Report Lab, OBD-II PIDS, Jul. 6, 2010.
Flores, J., Wireless Diagnostics and Consultancy Services, Vital Engineering, Jan. 4, 2007.
Fluke, Fluke 199B / 003 Scopemeter 200 MHz, Dual Portable Multimeter and Oscilloscope, downloaded from the World Wide Web at web.archive.org/web/20100413065253/http://www.fluke199.com/ as archived on Apr. 12, 2010.
Fluke Corporation, ScopeMeter 120 and 190 Series incl. 225C and 215C, Technical Data, Jan. 2010.
Fluke Corporation, Fluke 19xC-2x5C Scopemeter, Software version 8.00 onwards, Users Manual, Jul. 2008.
Jones, Mike, Senior FAE, Micrel Inc., Ethernet Driving Down Automotive Cost of Ownership; Oct. 31, 2008.
Nucology Engineering, Inc., Nology, PDA-Dyno and OBD II Scan Tool Operating Manual, 2009.
obd-2.com, OBDII Automotive Scan Tool and Virtual Dashboard, downloaded from the World Wide Web at .obd-2.com/ on Jul. 11, 2010.
U.S. Appl. No. 12/859,077, filed Aug. 18, 2010.
U.S. Appl. No. 12/858,699, filed Aug. 18, 2010.
U.S. Appl. No. 12/859,082, filed Aug. 18, 2010.
U.S. Appl. No. 13/189,940, filed Jul. 25, 2011.
U.S. Appl. No. 13/205,318, filed Aug. 8, 2011.
U.S. Appl. No. 13/198,974, filed Aug. 5, 2011.
U.S. Appl. No. 12/913,249, filed Oct. 27, 2010.
U.S. Appl. No. 12/913,184, filed Oct. 27, 2010.
U.S. Appl. No. 12/859,011, filed Aug. 18, 2010.
U.S. Appl. No. 12/859,040, filed Aug. 18, 2010.
U.S. Appl. No. 12/858,725, filed Aug. 18, 2010.
U.S. Appl. No. 13/198,426, filed Aug. 4, 2011.
Bluetooth SIG Inc., Bluetooth Specification Version 4.0, vol. 2, "Core System Package [BR/EDR Controller volume]," Part C "Link Manager Protocol Specification," Section 4.2 "Security", pp. 247-275, Jun. 30, 2010.
Engineer Live, "Ethernet makes it way into the car," Article date: Jun. 9, 2009, downloaded from the World Wide Web at engineerlive.com/Design-Engineer/Automotive_Design/Ethernet_makes_its_way_into_the_car/21822/ on Jul. 25, 2011, 4 pages.
OBD-II PIDs, downloaded from the World Wide Web at web.archive.org/web/20100329141311/http://en.wikipedia.org/wiki/OBD-II_PIDs, as available on Mar. 29, 2010, 13 pages.
Sorion Electronic Limited, J1962—OBD Diagnostics Connectors, downloaded from World Wide Web at sorion-group.com/SEL0051_connector.htm on May 24, 2010, pp. 1-3.
Memopad, The OBD2 Cable for Allpro adapter, downloaded from the World Wide Web at datawave.oommm.com/entry/USB-OBD2-AllPro-adapter, pp. 1-16, Oct. 8, 2008.
Tyco Electronics, Fundamentals of PolySwitch Overcurrent and Overtemperature Devices, pp. 1-13, Sep. 2, 2009.
International Organization for Standardization, ISO TC 22/SC 3, ISO 15031-1:2001(E), Road vehicles—Communication between vehicle and external test equipment for emissions-related diagnostics—Part 1: General information, 36 pages, Aug. 5, 2001.
International Organization for Standardization, ISO TC 22/SC 3 N, ISO/CD 22900-2, Road vehicles, Modular VCI (Vehicle Communication Interface)—Part 2: D-PDU API (Diagnostic Protocol Data Unit Application Programmer Interface), 144 pages, Mar. 31, 2005.
International Organization for Standardization, ISO TC 22/SC 3 N, ISO/CD 22900-1, Road vehicles—Modular Vehicle Communication Interface (MVCI)—Part 1: Hardware design requirements, 29 pages, Mar. 31, 2005.
International Organization for Standardization, ISO TC 22/SC 3 N, ISO/CD 22900-1, Road vehicles—Modular Vehicle Communication Interface (MVCI)—Part 3: D-Server API (Diagnostic Server Application Programmer Interface), 159 pages, Mar. 31, 2005.
International Organization for Standardization, ISO 15031-3:2400(E), Road vehicles—Communication between vehicle and external equipment for emissions-related diagnostics—Part 3: Diagnostic connector and related electrical circuits, specification and use—Annex B pp. 17-18, Jul. 2004.
Vital Engineering, Support and Frequently Asked Question regarding the Car-Pal OBD Interace Unit, Jan. 4, 2007, downloaded from the World Wide Web at .vitalengineering.co.uk/support.htm, 8 pages.
Tech Shop Magazine; Snap-on Introduces VERDICT Diagnostic and Information System; Aug. 26, 2010; downloaded from the World Wide Web at http://www.techshopmag.com/Controls/PrinterFriendly/PrinterFriendly.aspx, 3 pages.
Snap-on Incorporated, MODIS, Scanner Plug-in User Manual, ZEEMS303L, Rev. A, Aug. 2009, 61 pages.
Snap-on Incorporated, MODIS, Display User Manual, ZEEMS300N, Rev. A, Aug. 2009, 72 pages.
Snap-on Incorporated, MODIS, Component Tests User Manual, ZEEMS308G, Rev. C, Feb. 2009, 52 pages.
Snap-on Incorporated, MODIS, Flexible Gas Analyzer User Manual, ZEEMS306B, Rev. A, Aug. 2009, 47 pages.
Snap-on Incorporated, MODIS, Lab Scope Plug-in User Manual, ZEEMS305K, Rev. C, Feb. 2009, 73 pages.
International Searching Authority, PCT International Search Report, regarding International application No. PCT/US2011/047336, mailing date of the international search report Nov. 29, 2011.
International Searching Authority, PCT Written Opinion of the International Searching Authority, regarding International application No. PCT/US2011/047336, mailing date of the written opinion Nov. 29, 2011.
Metzelaar, R.H.M., Automotive Oscilloscope Applications, Peugeot 205 Holding Back, downloaded from the World Wide Web at .tiepie.com/uk/automotive/GMT/peugeot_205_holding_back.html on Jul. 12, 2010, pp. 1-4.

* cited by examiner

SYSTEM AND METHOD FOR SIMULTANEOUS DISPLAY OF WAVEFORMS GENERATED FROM INPUT SIGNALS RECEIVED AT A DATA ACQUISITION DEVICE

RELATED APPLICATIONS

This application claims priority to U.S. provisional patent application No. 61/374,845 filed on Aug. 18, 2010. U.S. provisional patent application No. 61/374,845 is incorporated herein by reference.

BACKGROUND

Vehicles, such as automobiles, light-duty trucks, and heavy-duty trucks, play an important role in the lives of many people. To keep vehicles operational, some of those people rely on vehicle technicians to diagnose and repair their vehicle.

Vehicle technicians use a variety of tools in order to diagnose and/or repair vehicles. Those tools may include common hand tools, such as wrenches, hammers, pliers, screwdrivers and socket sets, or more vehicle-specific tools, such as cylinder hones, piston ring compressors, and vehicle brake tools. The tools used by vehicle technicians may also include electronic tools such as a digital voltage-ohm meter (DVOM), a vehicle scan tool that communicates with an electronic control unit (ECU) within a vehicle, and an oscilloscope to display waveforms generated from electrical signals received at the oscilloscope.

Vehicle technicians occasionally desire to compare waveforms generated from input signals received from multiple vehicle components that perform similar function. For instance, a vehicle with an 8 cylinder engine may have 8 fuel injectors. If a vehicle technician suspects that one of the fuel injectors or electrical wiring associated with that fuel injector is malfunctioning, the vehicle technician may desire to compare waveforms generated from input signals received from the suspect fuel injector and its associated wiring to waveforms generated from input signals received from a fuel injector and its associated wiring believed to be operating properly. The vehicle technician would not want to spend a lot of time setting up the oscilloscope in order to display the waveforms generated from input signals received from both fuel injectors and/or the wiring associated with both fuel injectors.

OVERVIEW

The detailed description that follows this overview describes multiple example embodiments. Those example embodiments include embodiments in which an input channel of a data acquisition (DAQ) device receives input signals that are subsequently displayed on a display as present-time waveforms, and while the input signals are displayed as present-time waveforms, one or more of the input signals is tagged as a historical waveform to be displayed on the display. The display can display, simultaneously, a present-time waveform for an input channel of the DAQ device and a historical waveform for that same input channel.

In one respect, an example embodiment may take the form of a method comprising (i) receiving a first input signal at a first input channel of a DAQ device, (ii) after receiving the first input signal at the first input channel, refreshing a display to visually present the first input signal at the first input channel as a first present-time waveform for the first input channel, (iii) receiving, while the first input signal at the first input channel is visually presented as the first present-time waveform for the first input channel, a first user input at a user interface and responsively tagging the first input signal at the first input channel as a first historical waveform for the first input channel, and (iv) after receiving the first input signal at the first input channel, receiving a second input signal at the first input channel and responsively refreshing the display to visually present, simultaneously, the second input signal at the first input channel as a second present-time waveform for the first input channel and the first input signal at the first input channel as the first historical waveform for the first input channel.

In another respect, an example embodiment may take the form of a system comprising (i) a first input channel that receives input signals, wherein the input signals received at the first input channel comprise a first input signal at the first input channel and a second input signal at the first input channel, wherein the first input signal at the first input channel is at the first input channel prior to the second input signal at the first input channel, (ii) a display that is operable to visually present each input signal at the first input channel as a respective present-time waveform for the first input channel, wherein, after receipt of the first input signal at the first input channel, the display is refreshed to visually present the first input signal at the first input channel as a first present-time waveform for the first input channel, (iii) a processor, (iv) a user interface that is operable to receive user inputs, and (v) a data storage device containing computer-readable program instructions that are executable by the processor to tag input signals as historical waveforms. In response to the user interface receiving a first user input while the first input signal at the first input channel is visually presented as the first present-time waveform for the first input channel, the processor executes the computer-readable program instructions to tag the first input signal at the first input channel as a first historical waveform for the first input channel. After receipt of the second input signal at the first input channel, the display is refreshed to visually present, simultaneously, the first input signal at the first input channel as the first historical waveform for the first input channel and the second input signal at the first input channel as a second present-time waveform for the first input channel.

These as well as other aspects and advantages will become apparent to those of ordinary skill in the art by reading the following detailed description, with reference where appropriate to the accompanying drawings. Further, it should be understood that the embodiments described in this overview and elsewhere are intended to be examples only and do not necessarily limit the scope of the invention.

BRIEF DESCRIPTION OF THE DRAWINGS

Example embodiments are described herein with reference to the drawings, in which.

DETAILED DESCRIPTION

I. Introduction

This description describes, among other things, example embodiments that are directed to a display that is operable to visually present, simultaneously, waveforms generated from input signals received at the input channels of a data acquisition (DAQ) device. The input signals may comprise input signals received at different input channels or at a common input channel of the DAQ device. The display may be an element of the DAQ device. Alternatively, the display may be an element of a display device that is remote from the DAQ device. In the alternative arrangement, the DAQ device may transmit data, necessary to display the input signals as waveforms at the display device, to a wireless network for transmission, in turn, to the display device.

The DAQ device may comprise one or more input channels. Each of the input channels may include and/or connect to an input lead that obtains input signals from one or more signal acquisition points. The input signals received at the input channel(s) of the DAQ device may be visually presented as a waveform on a display. The most-recent input signal received at each input channel of the DAQ device may be displayed as a present-time waveform. Input signals received at each input channel prior to the most-recent input signal(s) may be displayed as historical waveforms.

II. Example Architecture

Figure 1:
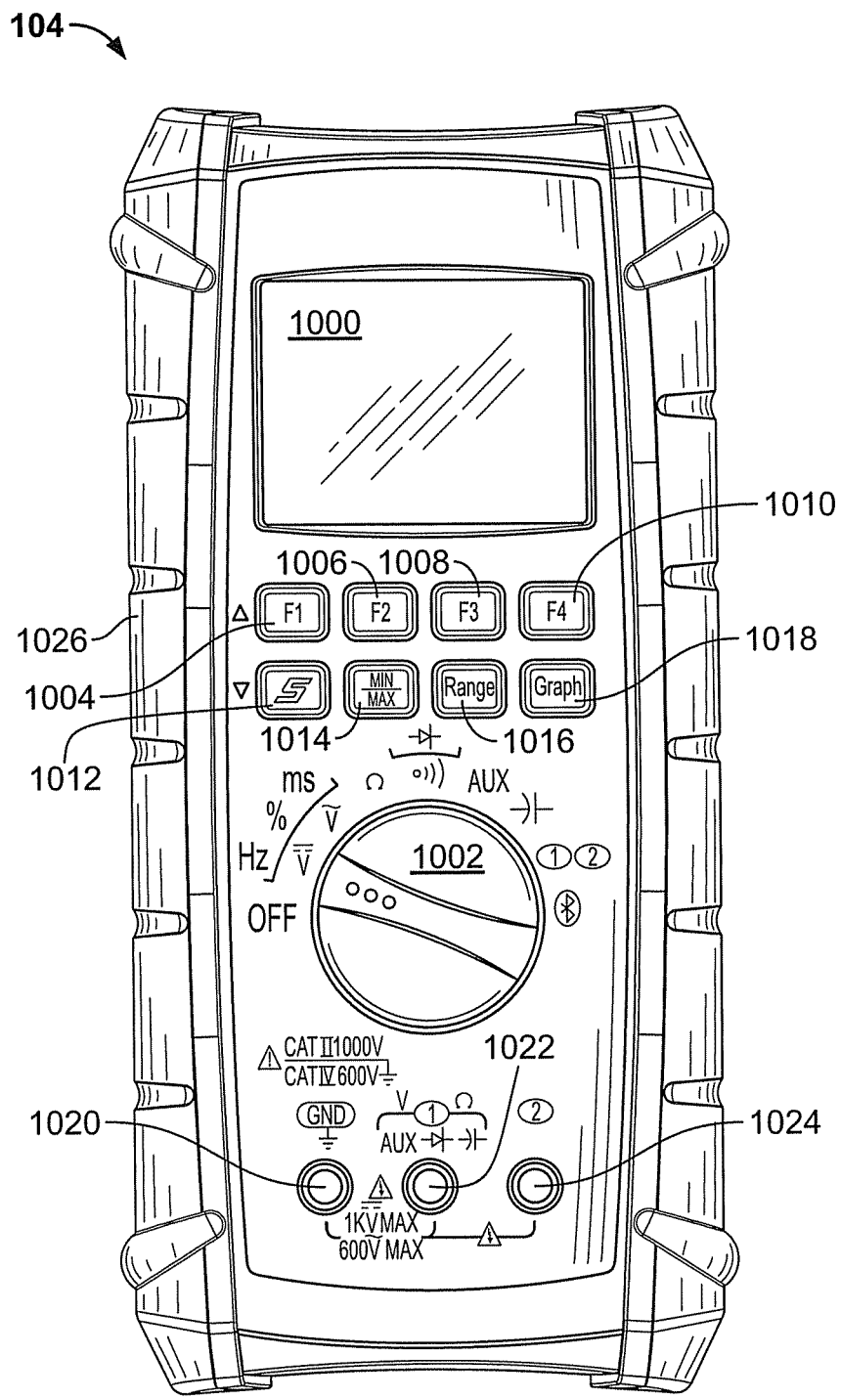
FIG. 1 illustrates an example data acquisition (DAQ) device.
Figure 2:
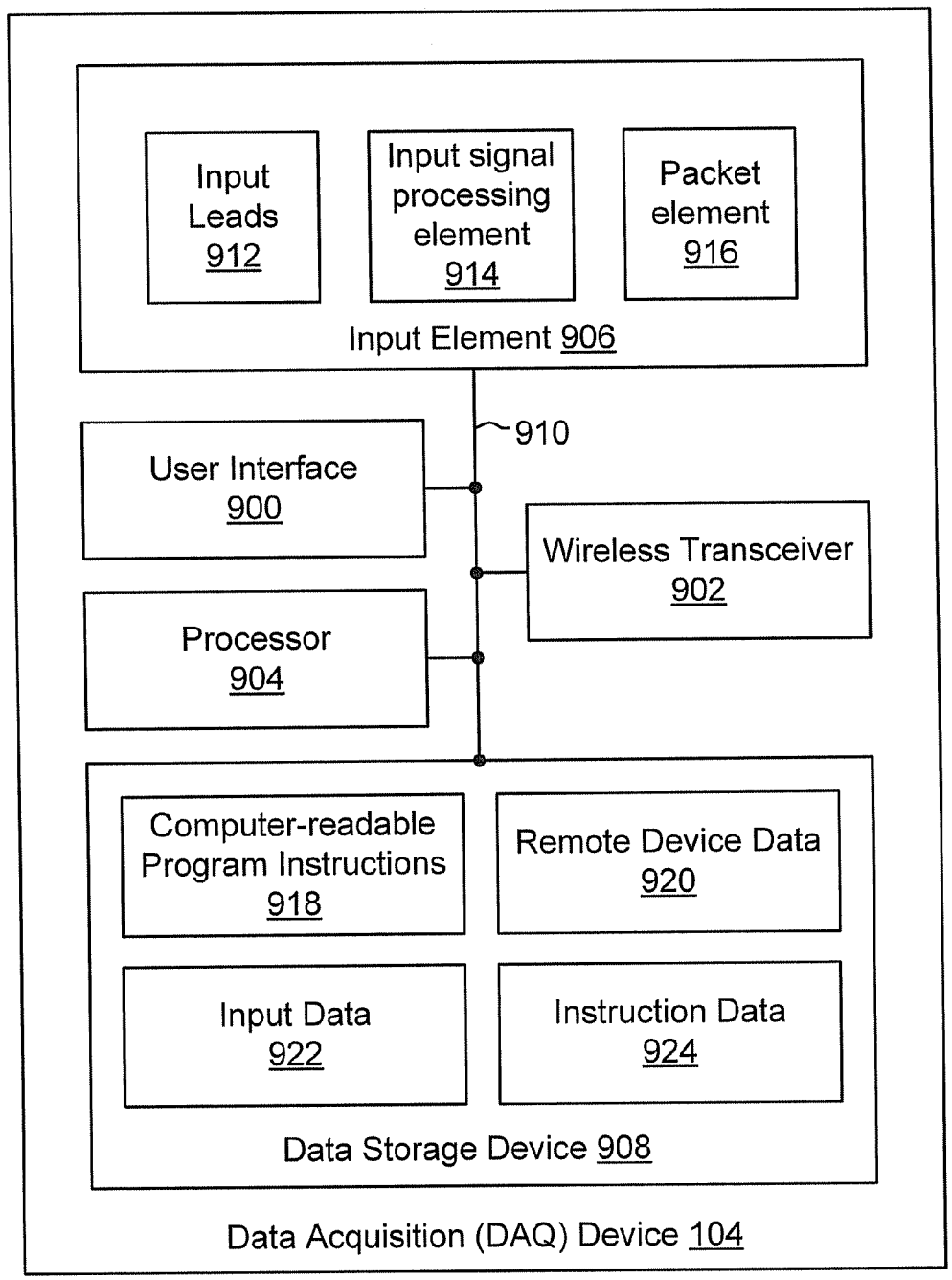
FIG. 2 is a block diagram of the DAQ device illustrated in FIG. 1.
Figure 3:
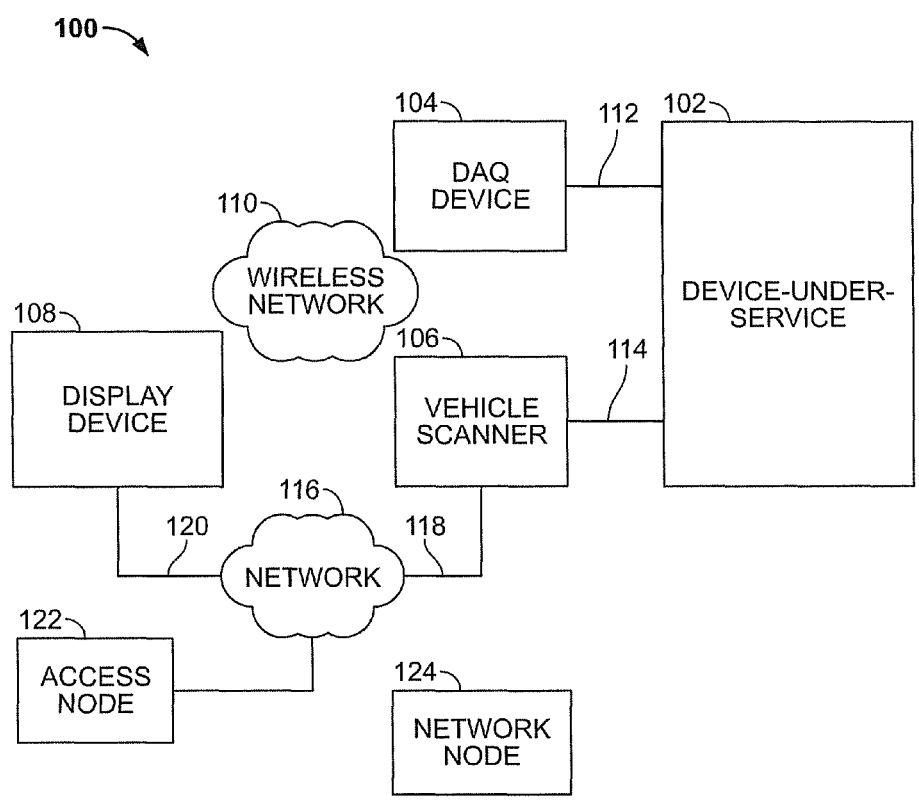
FIG. 3 is a block diagram of a system including the DAQ device illustrated in FIG. 1.

FIG. 1 illustrates an example embodiment of a DAQ device 104. FIG. 2 is a block diagram of DAQ device 104, and FIG. 2 illustrates that DAQ device 104 includes a user interface 900, a wireless transceiver 902, a processor 904, an input element 906, and a data storage device 908, all of which may be linked together via a system bus, network, or other connection mechanism 910. FIG. 3 illustrates an example system 100 including DAQ device 104 and further including a device-under-service 102, a vehicle scanner 106, a display device 108, a wireless network 110, a network 116, an access node 122, and a network node 124. The items illustrated in FIG. 3 are described in expired U.S. Patent Application No. 61/374,707, which is incorporated herein by reference, and which was filed on Aug. 18, 2010, and is entitled "System and Method for integrating devices for servicing a device-under service." The items illustrated in FIG. 3 are also described in expired U.S. Patent Application No. 61/374,723, which is incorporated herein by reference, and which was filed on Aug. 18, 2010, and is entitled "Method and apparatus to use remote and local control modes to acquire and visually present data."

FIG. 1 illustrates elements of user interface 900. Those elements include display 1000 and selector devices 1002, 1004, 1006, 1008, 1010, 1012, 1014, 1016, and 1018. For purposes of this description, "selector devices 1004-1018" refers to selector devices 1004, 1006, 1008, 1010, 1012, 1014, 1016, and 1018. FIG. 1 also illustrates (i) ports 1020, 1022, and 1024, which are part of input element 906, and (ii) a grip 1026 that provides DAQ device 104 with shock protection in the event that DAQ device 104 is dropped or struck.

The elements illustrated in FIG. 1 and the elements illustrated in the other figures accompanying this description are provided merely as examples and are not intended to be limiting. Many of the elements illustrated in the figures and/or described herein are functional elements that may be implemented as discrete or distributed components or in conjunction with other components, and in any suitable combination and location. Those skilled in the art will appreciate that other arrangements and elements (for example, machines, interfaces, functions, orders, and groupings of functions, etc.) can be used instead. Furthermore, various functions described as being performed by one or more elements can be carried out by a processor executing computer-readable program instructions and/or by any combination of hardware, firmware, and software.

Display 1000 may comprise any of a variety of displays, such as a liquid crystal display (LCD), a plasma display, or some other type of display. Display 1000 is operable to visually present (e.g., display) data using numbers, letters, punctuation marks, pictures, graphs, waveforms, or some other visually presentable form of data. As an example, display 1000 can display waveforms (e.g., present-time waveforms and historical waveforms) generated from input signals received at input element 906. Generating waveforms displayable at display 1000 may include converting the input signals from an input signal in analog form to input data in a digital form.

Selector device 1002 may comprise a switch having multiple positions. As illustrated in FIG. 1, selector device 1002 comprises a rotary switch having nine positions, but selector device 1002 is not so limited. Each position of selector device 1002 is associated with an off mode or one or more data acquisition modes, and each position of selector device 1002 is associated with one or more symbols to identify the mode(s) associated with that position. Furthermore, each position of selector device 1002 may be associated with a local-control state (e.g., a state in which the off mode or data acquisition mode is selected by selector device 1002) or a remote-control state (e.g., a state in which a data acquisition mode is selected by display device 108).

Table 1 provides an example list of modes associated with each position of selector device 1002, and an example list of whether each position is associated with a local-control state or a remote-control state.

TABLE 1

| Position of selector device 1002 | Mode Control Type | Mode |
|---|---|---|
| Position 1 | Local-Control State | Off mode |
| Position 2 | Local-Control State | Volts DC mode |
| Position 3 | Local-Control State | Volts AC mode |
| Position 4 | Local-Control State | Resistance mode |
| Position 5 | Local-Control State | Diode/Continuity mode |
| Position 6 | Local-Control State | Auxiliary mode |
| Position 7 | Local-Control State | Capacitance mode |

TABLE 1-continued

| Position of selector device 1002 | Mode Control Type | Mode |
|---|---|---|
| Position 8 | Local-Control State | Oscilloscope mode |
| Position 9 | Remote-Control State | DAQ mode selected via remote display device |

Position 1 is associated with the symbol "OFF." The position numbers increase in a clockwise direction. The three circles on selector device 1002 are closest to a currently-selected position. In FIG. 1, position 2 is the currently-selected position.

Selector device 1002 may be turned to each of the nine positions. Turning selector device 1002 from a first position (not necessarily position 1) to a second position (not necessarily position 2) can cause DAQ device 104 to transition from a first DAQ mode that is associated with the first position to a second DAQ mode that is associated with the second position. Transitioning from the first DAQ mode to the second DAQ mode may be carried out, at least in part, by processor 904 executing program instructions contained in data storage device 908.

While selector device 1002 is positioned at a position corresponding to a remote-control state (e.g., position 9), wireless transceiver 902 may receive a mode-selection command transmitted from display device 108. The mode-selection command may be received in response to wireless transceiver 902 transmitting to display device 108 a request for a mode-selection command. The DAQ mode selected via display device 108 may comprise a mode that is selectable via DAQ device 104 (e.g., the Oscilloscope mode, the Volts DC mode, or the Resistance Mode).

Selector devices 1004-1018 may each comprise a respective push button, but selector devices 1004-1018 are not so limited. Each selector device of selector devices 1004-1018 may be pushed or pushed and released to enter a user input that triggers a function associated with that selector device to be initiated and/or carried out. Hereinafter in this description, pushing a selector device refers to pushing a selector device or pushing and releasing a selector device.

The function associated with each selector device of selector devices 1004-1018 may be dependent upon the position of selector device 1002. As an example, when selector device 1002 is in position 8 and DAQ device 104 is operating in the oscilloscope mode, selector device 1004 may be pushed to enter a user input that causes an input signal at an input channel to be tagged as a historical waveform to be displayed for that input channel, and selector device 1006 may pushed to enter a user input that causes an input signal at another input channel to be tagged as a historical waveform to be displayed for that other input channel. When selector device 1002 is in positions other than position 8, pushing selector device 1004 and 1006 may trigger other functions to be carried out.

Ports 1020, 1022, and 1024 may be arranged to receive a respective input lead of input element 906. Each input lead can include first and second ends. The first end of an input lead may comprise a banana plug. Ports 1020, 1022, and 1024 may each include a banana plug receptacle for receiving a banana plug of an input lead. The second end of each input lead may include an alligator clip, a quick-attach probe, or some other device for contacting the input lead to an input signal acquisition point.

Turning to FIG. 2, the block diagram of DAQ device 104 illustrates details of input element 906 and data storage device 908. In particular, FIG. 2 illustrates that input element 906 includes input leads 912, input signal processing element 914, and packet element 916, and data storage device 908 includes computer-readable program instructions (CRPI) 918, remote device data 920, input data 922, and instruction data 924.

Input leads 912 may include one or more input leads. Each of the input leads is operable to receive input signals from an input signal acquisition point. The input signal acquisition point may comprise any of a variety of locations at which an input signal can be acquired. In accordance with an example embodiment in which device-under-service 102 comprises an automobile, the input signal acquisition point may comprise a location on the automobile at which a voltage signal, current signal, air pressure signal, air temperature signal, oil pressure signal, oil temperature signal, or some other input signal can be acquired.

Each input lead of input leads 912 may include a first end and a second end. The first end of each input lead may be inserted into or otherwise attached to DAQ device 104, and the first end may comprise a banana plug. The second end of each input lead may be arranged in any of a variety of configurations. As an example, the second end of each input lead may be configured as (i) an alligator clip, such as an MTA85 alligator clip sold by Snap-on Incorporated, Kenosha, Wis., United States, (ii) a spring hook, such as an MTA80 spring hook sold by Snap-on Incorporated, (iii) a test probe, such as an MTA20 test probe sold by Snap-on Incorporated, or (iv) a backprobe, such as an MTTL7005 backprobe sold by Snap-on Incorporated. Other example configurations of the second end of an input lead are also possible.

Figure 5:
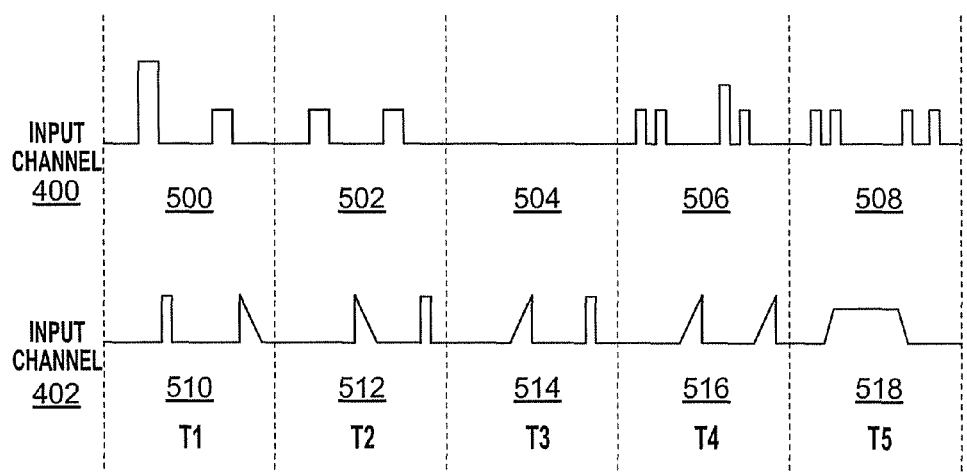
FIG. 5 illustrates example input signals received at input channels of a DAQ device.

Input signal processing element 914 is operable to convert an input signal received via input leads 912 into input data that is displayable at display 1000 (e.g., data displayable as a waveform). Additional details regarding input signal processing element 914 are illustrated in FIG. 5.

Packet-element 916 is operable to packetize the input data (e.g., place the input data into data packets) so as to generate data packets containing the input data. Packet-element 916 may provide the data packets to wireless transceiver 902 via connection mechanism 910 for subsequent transmission of the data packets via an air interface. In an alternative embodiment, processor 904 or some other portion of DAQ device 104 can comprise packet-element 916 or carry out the functions of packet-element 916. The data packets transmitted by wireless transceiver 902 may include input data for displaying present-time waveforms and historical waveforms on display device 108.

User interface 900 is operable to present data to a user and to enter user inputs (e.g., selection of a particular position of selector device 1002, and pushing a selector device of selector devices 1004-1018). User interface 900 may include display 1000 to visually present data, such as data obtained and/or generated by input element 906, data obtained via wireless transceiver 902, and/or data contained in data storage device 908. User interface 900 may include selector devices 1002 and selector devices 1004-1018.

Wireless transceiver 902 may comprise a single wireless transceiver that is operable to carry out communications via wireless network 110. Wireless transceiver 902 may carry out communications with vehicle scanner 106, display device 108, and/or some other device that is operating to communicate via wireless network 110. As an example, wireless transceiver 902 may comprise a transceiver that is operable to carry out communications via a BLUETOOTH® network. For purposes of this description, a transceiver that is operable to carry out communications via a BLUETOOTH® network is referred to as a BLUETOOTH® transceiver. As another example, wireless transceiver 902 may comprise a transceiver that is operable to carry out communications via a WI-FI® network. For purposes of this description, a transceiver that is operable to carry out communications via a WI-FI® network is referred to as a WI-FI® transceiver.

Each wireless transceiver of the example embodiments may operate in a transceiver-on-state. In the transceiver-on-state, the transceiver is powered on. While operating in the transceiver-on-state, the transceiver can transmit and receive data via an air interface of wireless network 110. For some transceivers, while operating in the transceiver-on-state, the transceiver can transmit and receive data via the air interface simultaneously. For other transceivers, at any given time while operating in the transceiver-on-state, the transceiver can either transmit data or receive data via the air interface. Each wireless transceiver of the example embodiments may operate in a transceiver-off-state. While operating in the transceiver-off-state, the transceiver does not transmit or receive data via an air interface. While operating in the transceiver-off-state, the transceiver can be powered off.

Processor 904 may comprise one or more general purpose processors (e.g., INTEL® microprocessors) and/or one or more special purpose processors (e.g., digital signal processors). Processor 904 may execute computer-readable program instructions (CRPI) 918 that are contained in computer-readable data storage device 908.

Data storage device 908 may comprise a computer-readable storage medium readable by processor 904. The computer-readable storage medium may comprise volatile and/or non-volatile storage components, such as optical, magnetic, organic or other memory or disc storage, which can be integrated in whole or in part with processor 904.

CRPI 918 may comprise various program instructions executable by processor 904. As an example, CRPI 918 may comprise program instructions that are executable to cause data storage device 908 to store data for generating a waveform. The data for generating a waveform may comprise digital data that is generated by input signal processing element 914 in response to an analog input signal received from one of the input leads 912.

As another example, CRPI 918 may comprise program instruction (referred to herein as PI-918-E) that are executable to tag input signals as input signals to be displayed as historical waveforms. Processor 904 may execute PI-918-E in response to a selector device of selector device 1004-1018 being pushed while a present-time waveform is being displayed on display 1000. Each input channel of DAQ device 104 may be associated with a particular selector device that can be pushed to cause a present-time waveform for that input channel to be tagged as a historical waveform for that input channel.

As another example, CRPI 918 may comprise program instructions (referred to herein as PI-918-F) that are executable to refresh display 1000 and/or to determine which waveform(s) should be displayed on display 1000 each time it is refreshed. As an example, execution of PI-918-F may cause processor 904 to determine that a particular input signal for a first input channel of DAQ device 104 is to be displayed as a historical waveform and to cause display 1000 to display the particular input signal as a historical waveform when the display is refreshed. Causing display 1000 to display a particular input signal may include retrieving from data storage device 908 data tagged as a historical waveform for a particular input channel. Execution of PI-918-F to refresh display 1000 may include causing display 1000 to simultaneously display a present-time waveform and a historical waveform for the first input channel. Moreover, PI-918-F may be executed to refresh display 1000 to simultaneously display historical and present-time waveforms for multiple input channel of DAQ device 104.

Remote device data 920 may include data associated with a device that is arranged to communicate with DAQ device 104 via wireless network 110. For example, remote device data 920 may include data associated with display device 108, such as a radio identifier and password associated with display device 108. The data associated with display device 108 may be received at DAQ device 104, for storing as remote device data 920, during a pairing process carried out between display device 108 and DAQ device 104. The pairing process between DAQ device 104 and display device 108 may include DAQ device 104 providing display device 108 with the data associated with DAQ device 104 and display device 108 providing DAQ device 104 with data associated with display device 108. After carrying out that paring process with display device 108, DAQ device 104 may use the remote device data 920 when establishing wireless network 110 with display device 108.

Input data 922 may comprise data generated by input signal processing element 914. As an example, input data 922 may comprise digital data generated from an analog input signal received at an input channel of DAQ device 104 and provided to input signal processing element 914. Data storage device 908 may include tags (e.g., pointers) that identify which data of input data 922 is tagged for displaying historical waveforms for the input channels of DAQ device 104. Input data 922 may also comprise data generated from input signal processing element 914 for displaying as a present-time waveform for the input channels of DAQ device 104.

Instruction data 924 may comprise data that identifies how to connect a portion of the DAQ device 104 to device-under-service 102, how to operate device-under-service 102, inspections to carry out on device-under-service 102, or some other instruction data. Instruction data 924 may comprise various data including numbers, letters, punctuation marks, pictures, graphs, waveforms, or some other visually presentable form of data.

Returning to FIG. 3, FIG. 3 illustrates system 100 including DAQ device 104, device-under-service 102, vehicle scanner 106, display device 108, wireless network 110, network 116, access node 122, and network node 124. Display device 108 may be referred to as a controller device since display device 108 may operate as a master of DAQ device 104 and/or vehicle scanner 106 when those devices are operating as a slave device or slave scanner, respectively.

DAQ device 104 may connect to device-under-service 102 via wired link 112, whereas vehicle scanner 106 may connect to device-under-service 102 via wired link 114. Wired link 112 may comprise input leads 912. Wired link 114 may be arranged as a cable assembly described in expired U.S. Patent Application No. 61/374,805, which is incorporated herein by reference, and which was filed on Aug. 18, 2010, and is entitled "Cable assembly for protection against undesired signals," or wired link 114 may be arranged as some other wired link. DAQ device 104 may comprise a digital volt meter (DVM), a digital volt ohm meter (DVOM), an oscilloscope, or some other type of measurement device that operates to acquire data from device-under-service 102. Vehicle scanner 106 may comprise a device that operates to request and/or monitor data from an electronic control unit (ECU) of device-under-service 102.

Device-under-service 102 may comprise a vehicle, such as an automobile, a motorcycle, a semi-tractor, light-duty trucks, medium-duty trucks, heavy-duty trucks, farm machinery, or some other vehicle. System 100 is operable to carry out a variety of functions, including functions for servicing device-under-service 102. The example embodiments of this description may include or be utilized with any appropriate voltage or current source, such as a battery, an alternator, a fuel cell, and the like, providing any appropriate current and/or voltage, such as about 12 volts, about 42 volts, and the like. The example embodiments may be used with any desired system or engine. Those systems or engines may comprise items utilizing fossil fuels, such as gasoline, natural gas, propane, and the like, electricity, such as that generated by battery, magneto, fuel cell, solar cell and the like, wind and hybrids or combinations thereof. Those systems or engines may be incorporated into other systems, such as an automobile, a truck, a boat or ship, a motorcycle, a generator, an airplane and the like.

Vehicle scanner 106 and display device 108 may connect to network 116 via wired links 118 and 120, respectively. Network 116 may include and/or connect to the Internet, and network 116 may include and/or connect to one or more network nodes, such as an access node 122 and a network node 124. Access node 122 may provide any of DAQ device 104, vehicle scanner 106, and display device 108 with wireless connectivity to network 116. Network node 124 may comprise a desktop personal computer (PC), a workstation that executes a Unix-based or Linux-based operating system, or some other node that interfaces and/or connects to network 116. In accordance with an example embodiment in which device-under-service 102 comprises an automobile, network node 124 may comprise a desktop PC or workstation operating at an automobile repair facility. In that regard, network node 124 may operate as a server that provides data (e.g., automobile repair data and/or instruction data) to display device 108.

DAQ device 104, vehicle scanner 106, and display device 108 are operable to carry out communications with each other via wireless network 110. Wireless network 110 may comprise one or more wireless networks. Each of the one or more wireless networks may be arranged to carry out communications according to a respective air interface protocol. Each air interface protocol may be arranged according to an industry standard, such as an Institute of Electrical and Electronics Engineers (IEEE®) 802 standard. The IEEE® 802 standard may comprise an IEEE® 802.11 standard for Wireless Local Area Networks (e.g., IEEE® 802.11 a, b, g, or n standard), an IEEE® 802.15 standard for Wireless Personal Area Networks, an IEEE® 802.15.1 standard for Wireless Personal Area Networks—Task Group 1, an IEEE® 802.16 standard for Broadband Wireless Metropolitan Area Networks, or some other IEEE® 802 standard. For purposes of this description, a wireless network arranged to carry out communications according to the IEEE® 802.11 standard is referred to as a WI-FI® network, and a wireless network arranged to carry out communications according to the IEEE® 802.15.1 standard is referred to as a BLUETOOTH® network.

In an alternative embodiment, device-under-service 102 may comprise a device other than a vehicle, such as a refrigeration unit, a personal computer, or some other serviceable device. Additionally or alternatively, the device-under-service may comprise a system such as a heating, ventilation, and air conditioning (HVAC) system, a security system, a computer system (e.g., a network), or some other serviceable system.

Figure 4:
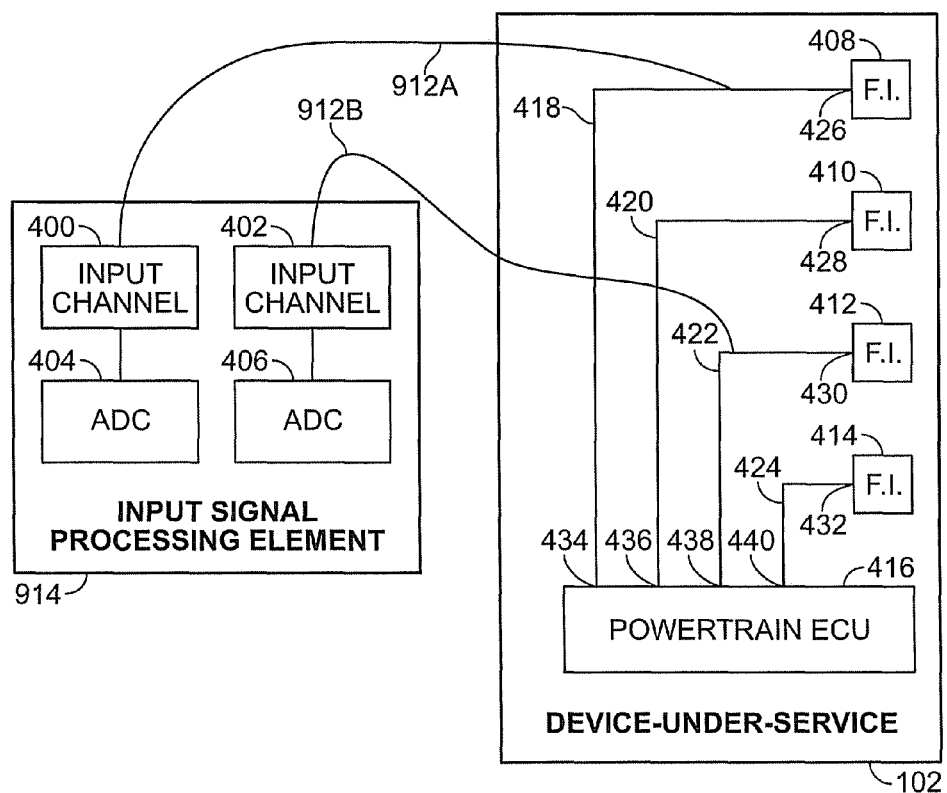
FIG. 4 illustrates an example input signal processing element and an example device-under service.

Next, FIG. 4 illustrates example input leads of input leads 912, details of input signal processing element 914, and details of device-under-service 102. The example input leads include input lead 912A and 912B. FIG. 4 illustrates that input signal processing element 914 includes input channels 400 and 402 and analog-to-digital converter (ADC) 404 and ADC 406. Input channel 400 may be associated with port 1022 and input channel 402 may be associated with port 1024. Input channels may be operational when selector device 1002 is in position 8 such that DAQ device 104 operates in the oscilloscope mode. In an alternative embodiment, input signal processing element 914 may include only one input channel or more than two input channels.

In accordance with an example embodiment in which device-under-service 102 comprises an automobile, device-under-service 102 may be arranged as illustrated in FIG. 4. In such an embodiment, device-under-service 102 may include fuel injectors 408, 410, 412, and 414, a powertrain electronic control unit (ECU) 416, fuel injector leads 418, 420, 422, 424, and signal acquisition points 426, 428, 430, 432, 434, 436, 438, and 440.

When device-under-service 102 is operating normally, waveforms generated from input signals obtained at signal acquisition points 426, 428, 430, 432, 434, 436, 438, and 440 may be substantially similar. However, when device-under-service 102 is operating with a malfunctioning fuel injector (e.g., fuel injector 408) and three fuel injectors operating normally (e.g., fuel injectors 410, 412, and 414), waveforms generated from input signals obtained at signal acquisition points 426 and 434 may be substantially different from waveforms generated from input signals obtained at signal acquisition points 428, 430, 432, 436, 438, and 440. A technician working on device-under-service may be able to determine that fuel injector 408 is malfunctioning by comparing waveforms generated from input signals obtained at signal acquisition points 428, 430, 432, 436, 438, and 440 to waveforms generated from input signals obtained at signal acquisition points 426 and 434.

Next, FIG. 5 illustrates example input signals received at input channels 400 and 402. In particular, FIG. 5 illustrates inputs signals 500, 502, 504, 506, and 508 that are received at input channel 400, and input signals 510, 512, 514, 516, and 518 that are received at input channel 402. Each input signal shown in FIG. 5 is received during a given period of time represented by the time periods T1, T2, T3, T4, and T5. For FIG. 5, time passes from left to right, such that time period T1 occurs before time period T2, time period T2 occurs before time period T3, and so on.

The input signals obtained at input channels 400 and 402 may be obtained from a common signal acquisition point or from different signal acquisition points. For example, input signals 500 and 502 may be obtained from signal acquisition point 426, input signals 506 and 508 may be obtained from signal acquisition point 428, and input signal 504 may be obtained while input lead 912A is disconnected from signal acquisition point 426 and then moved to signal acquisition point 428. When an input lead connected to an input channel is not connected to a signal acquisition point, a waveform for the input channel can be a horizontal line to represent that the input lead is not connected to a signal acquisition point. As another example, input signals 510, 512, 514, 516, and 518 may be obtained from signal acquisition point 430 via input lead 912B.

Next, FIG. 6 through FIG. 11 illustrate an example waveform or waveforms being visually presented (i.e., displayed) on display 1000. Each waveform illustrated in FIG. 6 through FIG. 11 is identified by a 3-digit reference number followed by the letter P if the waveform is being displayed as a present-time waveform or the letter H if the waveform is being displayed as a historical waveform. The waveforms in FIG. 6 through FIG. 11 are generated from the input signal illustrated in FIG. 5 having the same 3-digit reference number. Other displays, such as the display 300 illustrated in FIG. 14, may display waveforms in the same way as display 1000.

Figure 6:
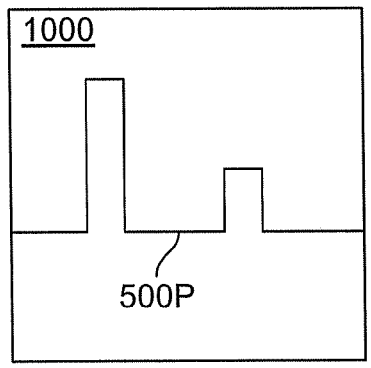
FIG. 6 illustrates an example waveform visually presented on a display.

FIG. 6, in particular, illustrates a present-time waveform 500P being displayed on display 1000. Waveform 500P is generated from input signal 500. Generating waveform 500P may include providing input signal 500 to ADC 404 so as to generate digital data representing input signal 500 and providing that digital data to display 1000 for displaying input signal 500 as waveform 500P. The digital data representing input signal 500 may be stored as input data 922. That digital data may be tagged for displaying input signal 500 as a historical waveform 500H.

Figure 7:
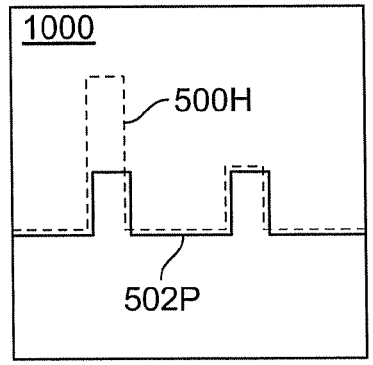
FIG. 7 illustrates example waveforms visually presented on a display.

Next, FIG. 7 illustrates a historical waveform 500H and a present-time waveform 502P being displayed on display 1000. Generating waveform 502P may include providing input signal 502 to ADC 404 so as to generate digital data representing input signal 502 and providing that digital data to display 1000 for displaying input signal 502 as waveform 502P. The digital data representing input signal 502 may be stored as input data 922. That digital data may be tagged for displaying input signal 502 as a historical waveform. Generating waveform 500H may include providing the digital data representing input signal 500 to display 1000 for displaying input signal 500 as waveform 500H. Generating waveform 500H may also include changing a characteristic (e.g., a color or line type) associated with the digital data representing input signal 500. Changing the characteristic allows present-time waveforms to be distinguished from historical waveforms.

Figure 8:
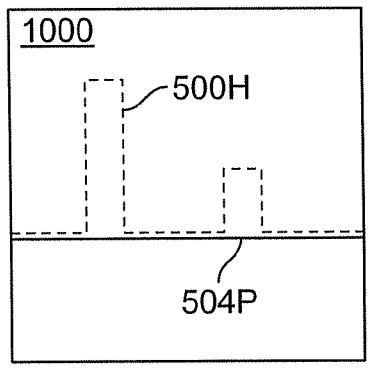
FIG. 8 illustrates example waveforms visually presented on a display.

Next, FIG. 8 illustrates a historical waveform 500H and a present-time waveform 504P being displayed on display 1000. Generating waveform 504P may include providing input signal 504 to ADC 404 so as to generate digital data representing input signal 504 and providing that digital data to display 1000 for displaying input signal 504 as waveform 504P. The digital data representing input signal 504 may be stored as input data 922. That digital data may be tagged for displaying input signal 504 as a historical waveform. Generating waveform 500H may include providing the digital data representing input signal 500 to display 1000 for displaying input signal 500 as waveform 500H.

Figure 9:
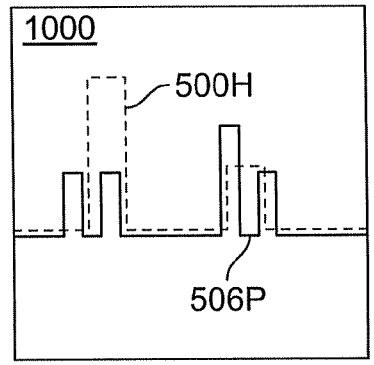
FIG. 9 illustrates example waveforms visually presented on a display.

Next, FIG. 9 illustrates a historical waveform 500H and a present-time waveform 506P being displayed on display 1000. Generating waveform 506P may include providing input signal 506 to ADC 404 so as to generate digital data representing input signal 506 and providing that digital data to display 1000 for displaying input signal 506 as waveform 506P. The digital data representing input signal 506 may be stored as input data 922. That digital data may be tagged for displaying input signal 506 as a historical waveform. Generating waveform 500H may include providing the digital data representing input signal 500 to display 1000 for displaying input signal 500 as waveform 500H.

Figure 10:
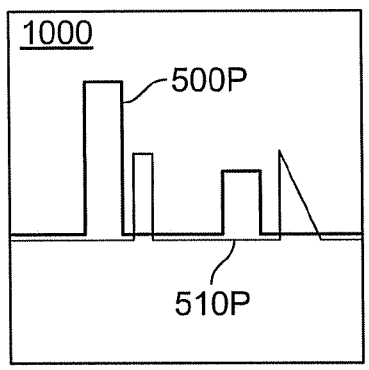
FIG. 10 illustrates example waveforms visually presented on a display.

Next, FIG. 10 illustrates a present-time waveform 500P and a present-time waveform 510P being displayed on display 1000. Generating waveform 500P may include providing input signal 500 to ADC 404 so as to generate digital data representing input signal 500 and providing that digital data to display 1000 for displaying input signal 500 as waveform 500P. Generating waveform 510P may include providing input signal 510 to ADC 406 so as to generate digital data representing input signal 510 and providing that digital data to display 1000 for displaying input signal 510 as waveform 510P. The digital data representing input signal 510 may be stored as input data 922. That digital data may be tagged for displaying input signal 510 as a historical waveform 510H.

Figure 11:
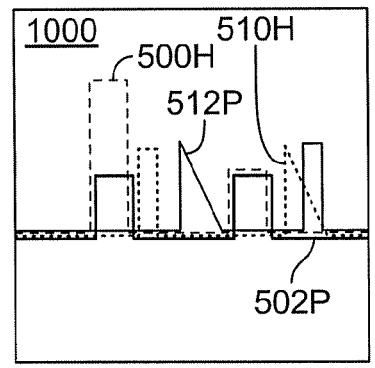
FIG. 11 illustrates example waveforms visually presented on a display.

Next, FIG. 11 illustrates present-time waveforms 502P and 512P being displayed simultaneously with historical waveforms 500H and 510H. Generating waveform 502P may include providing input signal 502 to ADC 404 so as to generate digital data representing input signal 502 and providing that digital data to display 1000 for displaying input signal 502 as waveform 502P. Generating waveform 512P may include providing input signal 512 to ADC 406 so as to generate digital data representing input signal 512 and providing that digital data to display 1000 for displaying input signal 512 as waveform 512P. Generating waveform 510H may include providing the digital data representing input signal 510 to display 1000 for displaying input signal 510 as waveform 510H. Generating waveform 510H may also include changing a characteristic (e.g., a color or line type) associated with the digital data representing input signal 510.

The waveforms displayed on a display of the example embodiments may have different display characteristics to distinguish each waveform from each other. The characteristics may include color, intensity, line completion (e.g., solid line versus dashed line), or some other characteristic.

Each waveform displayed on the display may be a different color. For example, in FIG. 11, present-time waveforms 502P and 512P may be displayed using red and blue lines, respectively, and historical waveforms 500H and 510H may be displayed using green and yellow lines, respectively. The display may visually present a legend that identifies red lines as present-time waveforms for input channel 400, green lines as historical waveforms for input channel 400, blue lines as present-time waveforms for input channel 402, and yellow lines as historical waveforms for input channel 402.

Additionally or alternatively, each waveform displayed on the display may be displayed using solid lines or dashed lines. For example, in FIG. 10, present-time waveforms 500P and 510P are each displayed using solid lines. As another example, in FIG. 11, present-time waveforms 502P and 512P are displayed using solid lines whereas historical waveforms 500H and 510H are displayed using dashed lines. The display may visually present a legend that identifies solid lines as present-time waveforms and dashed lines as historical waveforms.

Furthermore, the waveforms generated from input signals at common input channel may be displayed using a common color. For example, in FIG. 11, present-time waveform 502P may be displayed using solid red lines and historical waveform 500H may be displayed using dashed red lines, and present-time waveform 512P may be displayed using solid blue lines and historical waveform 510H may be displayed using dashed blue lines. Other examples of distinguishing present-time waveforms from historical waveforms and other examples of distinguishing waveforms for different input channels are also possible.

III. Example Operation

Figure 12:
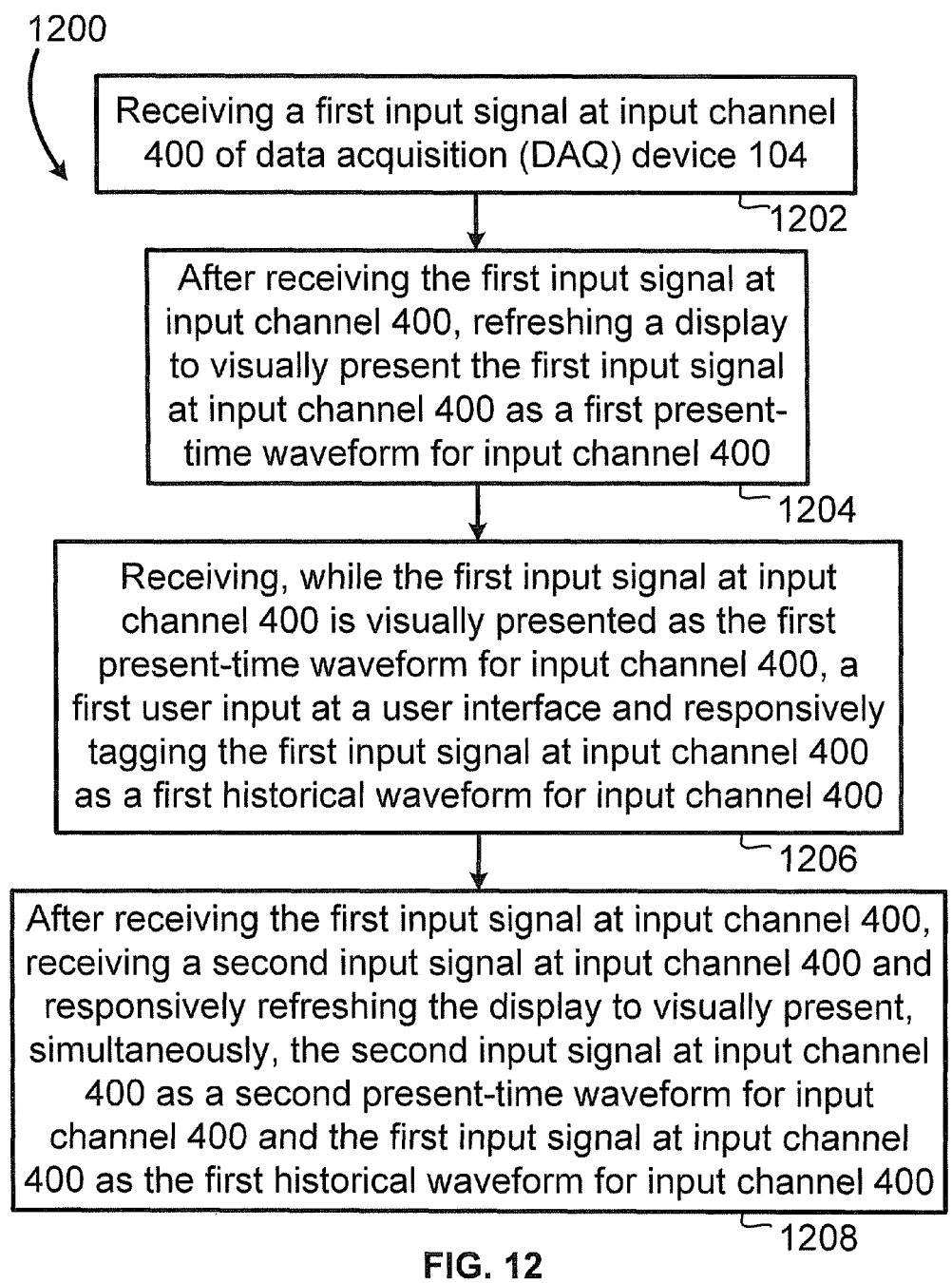
FIG. 12 is a flow chart depicting a set of functions that may be carried out in accordance with an example embodiment.

FIG. 12 depicts a flow chart that illustrates a set of functions 1200 that are listed in blocks 1202, 1204, 1206, and 1208. The set of functions 1200 may be carried out in accordance with an example embodiment.

Block 1202 includes receiving a first input signal at input channel 400 of DAQ device 104. Input channel 400 may receive the first input signal from device-under-service 102 via an input lead of input leads 912. In accordance with an example embodiment, the first input signal at input channel 400 may comprise an electrical signal acquired from a signal acquisition point on device-under-service 102, the electrical signal being definable, at least in part, by voltage and/or amperage values.

Next, block 1204 includes, after receiving the first input signal at input channel 400, refreshing a display to visually present the first input signal at input channel 400 as a first present-time waveform for input channel 400. As an example, refreshing the display may include refreshing display 1000 of DAQ device 104. Refreshing display 1000, at block 1204, may include display 1000 replacing each and every waveform currently being displayed on display 1000 (e.g., a present-time waveform) with a new present-time waveform. For block 1204, the new present-time waveform is the first present-time waveform for input channel 400. Once a present-time waveform is replaced with a new present-time waveform, the previously displayed waveform is no longer a present-time waveform. Furthermore, an input signal used to generate a present-time waveform may subsequently be used to generate a historical waveform for visually presenting at a display.

Additionally or alternatively, refreshing the display at block 1204 may include refreshing display 300 of display device 108. Refreshing display 300, at block 1204, may include display 300 replacing each and every waveform currently being displayed on display 300 (e.g., a present-time waveform) with a new present-time waveform. As stated above, for block 1204, the new present-time waveform is the first present-time waveform for input channel 400.

Next, block 1206 includes receiving, while the first input signal at input channel 400 is visually presented as the first present time waveform for input channel 400, a first user input at a user interface and responsively tagging the first input signal at input channel 400 as a first historical waveform for input channel 400.

In accordance with an example embodiment in which display 1000 is refreshed to visually present the first input signal at input channel 400 as the first present-time waveform for input channel 400, the user interface that receives the first user input may comprise user interface 900, and receiving the first user input may occur in response to one of selector devices 1004-1018 (e.g., selector device 1004) being pushed and processor 904 detecting that the selector device was pushed.

In accordance with an example embodiment in which display 300 is refreshed to visually present the first input signal at input channel 400 as the first present-time waveform for input channel 400, the user interface may comprise user interface 200, and receiving the first user input may occur in response to a control of user controls 306 (shown in FIG. 14) being pushed and a processor 204 (shown in FIG. 15) detecting that the control being pushed.

Next, block 1208 includes, after receiving the first input signal at input channel 400, receiving a second input signal at input channel 400 and responsively refreshing the display to visually present, simultaneously, the second input signal at input channel 400 as a second present-time waveform for input channel 400 and the first input signal at input channel 400 as the first historical waveform for input channel 400.

As an example, refreshing the display at block 1208 may include refreshing display 1000 of DAQ device 104. Refreshing display 1000, at block 1208, may include display 1000 replacing each and every waveform currently being displayed on display 1000 with a new present-time waveform and a historical waveform. For block 1208, the new present-time waveform may comprise the second present-time waveform for input channel 400 and the historical waveform may comprise the first historical waveform for input channel 400.

Additionally or alternatively, refreshing the display at block 1208 may include refreshing display 300 of display device 108. Refreshing display 300, at block 1208, may include display 300 replacing each and every waveform currently being displayed on display 300 with a new present-time waveform and a historical waveform. As stated above, for block 1208, the new present-time waveform may comprise the second present-time waveform for input channel 400 and the historical waveform may comprise the first historical waveform for input channel 400.

A display that visually presents historical waveforms may be refreshed so that the display is not displaying any historical waveforms. As an example, while display 1000 is displaying historical waveform 500H, a user input may be received at user interface 900 and the next time display 1000 is refreshed, display 1000 may be refreshed so that display 1000 does not visually present historical waveform 500H. In accordance with that example, the user input may be received in response to a user pushing a selector device on DAQ device 104 (e.g., selector device 1008). Refreshing display 1000 so that historical waveform 500H is not displayed may include refreshing the display to display one or more new present-time waveforms.

Figure 13:
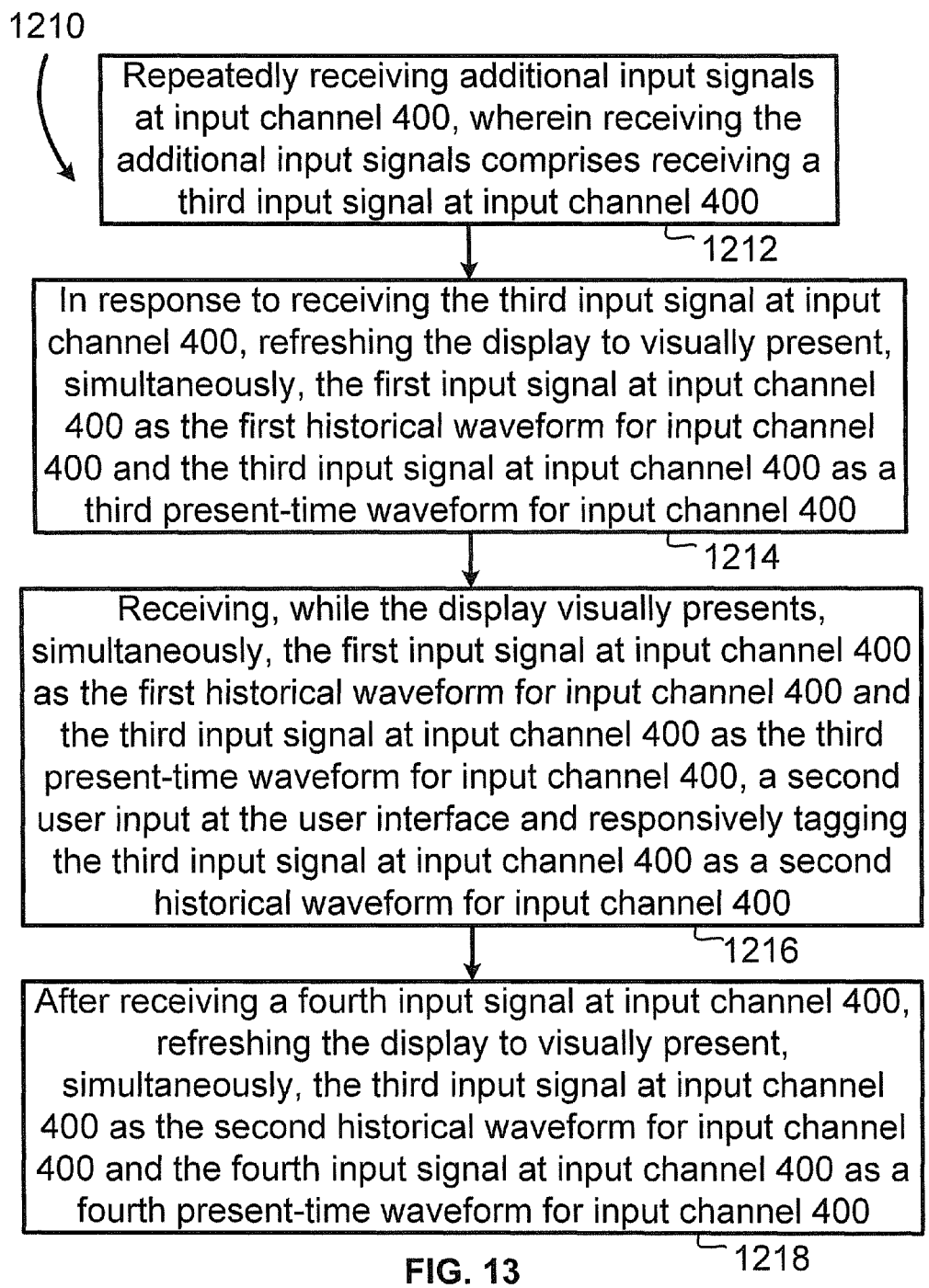
FIG. 13 is a flow chart depicting a set of functions that may be carried out in accordance with an example embodiment.

Next, FIG. 13 depicts a flow chart that illustrates a set of functions 1210 that are listed in blocks 1212, 1214, 1216, and 1218. The set of functions 1210 may be carried out in accordance with an example embodiment. The set of functions 1210 may be carried out after the set of functions 1200 are performed.

Block 1212 includes repeatedly receiving additional input signals at input channel 400, wherein receiving the additional input signals comprises receiving a third input signal at input channel 400. Receiving the additional input signals may occur after receiving the second input signal at input channel 400 in block 1208.

Next, block 1214 includes, in response to receiving the third input signal at input channel 400, refreshing the display to visually present, simultaneously, the first input signal at input channel 400 as the first historical waveform for input channel 400 and the third input signal at input channel 400 as a third present-time waveform for input channel 400.

As an example, refreshing the display at block 1214 may include refreshing display 1000 of DAQ device 104. Refreshing display 1000, at block 1214, may include display 1000 replacing each and every waveform currently being displayed on display 1000 with a new present-time waveform and a historical waveform. For block 1208, the new present-time waveform may comprise the third present-time waveform for input channel 400 and the historical waveform may comprise the first historical waveform for input channel 400.

Additionally or alternatively, refreshing the display at block 1214 may include refreshing display 300 of display device 108. Refreshing display 300, at block 1214, may include display 300 replacing each and every waveform currently being displayed on display 300 with a new present-time waveform and a historical waveform. As stated above, for block 1214, the new present-time waveform may comprise the third present-time waveform for input channel 400 and the historical waveform may comprise the first historical waveform for input channel 400.

Next, block 1216 includes receiving, while the display visually presents, simultaneously, the first input signal at input channel 400 as the first historical waveform for input channel 400 and third input signal at input channel 400 as the third present-time waveform for input channel 400, a second user input at the user interface and responsively tagging the third input signal at input channel 400 as a second historical waveform for input channel 400.

In accordance with an example embodiment in which display 1000 is refreshed to visually present the third input signal at input channel 400 as the third present-time waveform for input channel 400, the user interface that receives the second user input may comprise user interface 900, and receiving the second user input may occur in response to one of selector devices 1004-1018 (e.g., selector device 1004) being pushed and processor 904 detecting that the selector device was pushed.

In accordance with an example embodiment in which display 300 is refreshed to visually present the third input signal at input channel 400 as the third present-time waveform for input channel 400, the user interface may comprise user interface 200, and receiving the second user input may occur in response to a control of user controls 306 (shown in FIG. 14) being pushed and a processor 204 (shown in FIG. 15) detecting that the control being pushed.

Next, block 1218 includes, after receiving a fourth input signal at input channel 400, refreshing the display to visually present, simultaneously, the third input signal at input channel 400 as the second historical waveform for input channel 400 and the fourth input signal at input channel 400 as a fourth present-time waveform for input channel 400.

As an example, refreshing the display at block 1218 may include refreshing display 1000 of DAQ device 104. Refreshing display 1000, at block 1218, may include display 1000 replacing each and every waveform currently being displayed on display 1000 with a new present-time waveform and a historical waveform. For block 1218, the new present-time waveform may comprise the fourth present-time waveform for input channel 400 and the historical waveform may comprise the second historical waveform for input channel 400.

Additionally or alternatively, refreshing the display at block 1218 may include refreshing display 300 of display device 108. Refreshing display 300, at block 1218, may include display 300 replacing each and every waveform currently being displayed on display 300 with a new present-time waveform and a historical waveform. As stated above, for block 1218, the new present-time waveform may comprise the fourth present-time waveform for input channel 400 and the historical waveform may comprise the second historical waveform for input channel 400.

Returning to FIG. 4, DAQ device 104 may include multiple input channels. Input channel 402 may receive input signals that are visually presentable on a display as present-time waveforms for input channel 402 and historical waveforms for input channel 402. The following functions pertain to receiving input signals at input channel 402. Receiving the input signals at input channel 402 can comprise receiving a first input signal at input channel 402 and thereafter receiving a second input signal at input channel 402.

After receiving the first input signal at input channel 402, the display can be refreshed to visually present the first input signal at input channel 402 as a first present-time waveform for input channel 402.

While the first input signal at input channel 402 is visually presented as the first present-time waveform for input channel 402, a second user input can be received at the user interface and the first input signal at input channel 402 can be tagged as a first historical waveform for input channel 402.

After receiving the second input signal at input channel 402, the display can be refreshed to visually present, simultaneously, the first input signal at input channel 402 as the first historical waveform for input channel 402 and the second input signal at input channel 402 as the second input signal at input channel 402 as a second present-time waveform for input channel 402. This refreshing of the display can occur while the display is being refreshed to display waveforms generated from input signals received at input channel 400.

Refreshing the display can include refreshing the display simultaneously for multiple input channels. As an example, the display can be refreshed to simultaneously display (i) the first input signal at the first input channel as the first historical waveform, (ii) the second input signal at the first input channel as the second present-time waveform for the first input channel, (iii) the first input signal at the second input channel as the first historical waveform for the second input channel, and (iv) the second input signal at the second input channel as a second present-time waveform for the second input channel, or some other combination of waveforms from input signals received at input channels 400 and 402.

IV. Alternative Display

Display 300 of display device 108 can display present-time and historical waveforms that are generated by input signals received at DAQ device 104. The digital data generated by input signal processing element 914 and displayable at DAQ device 104 as present-time and historical waveforms can be transmitted to display device 108 via wireless network 110. Display device 108 can display the data received from DAQ device 104 as the present-time and historical waveforms.

Figure 14:
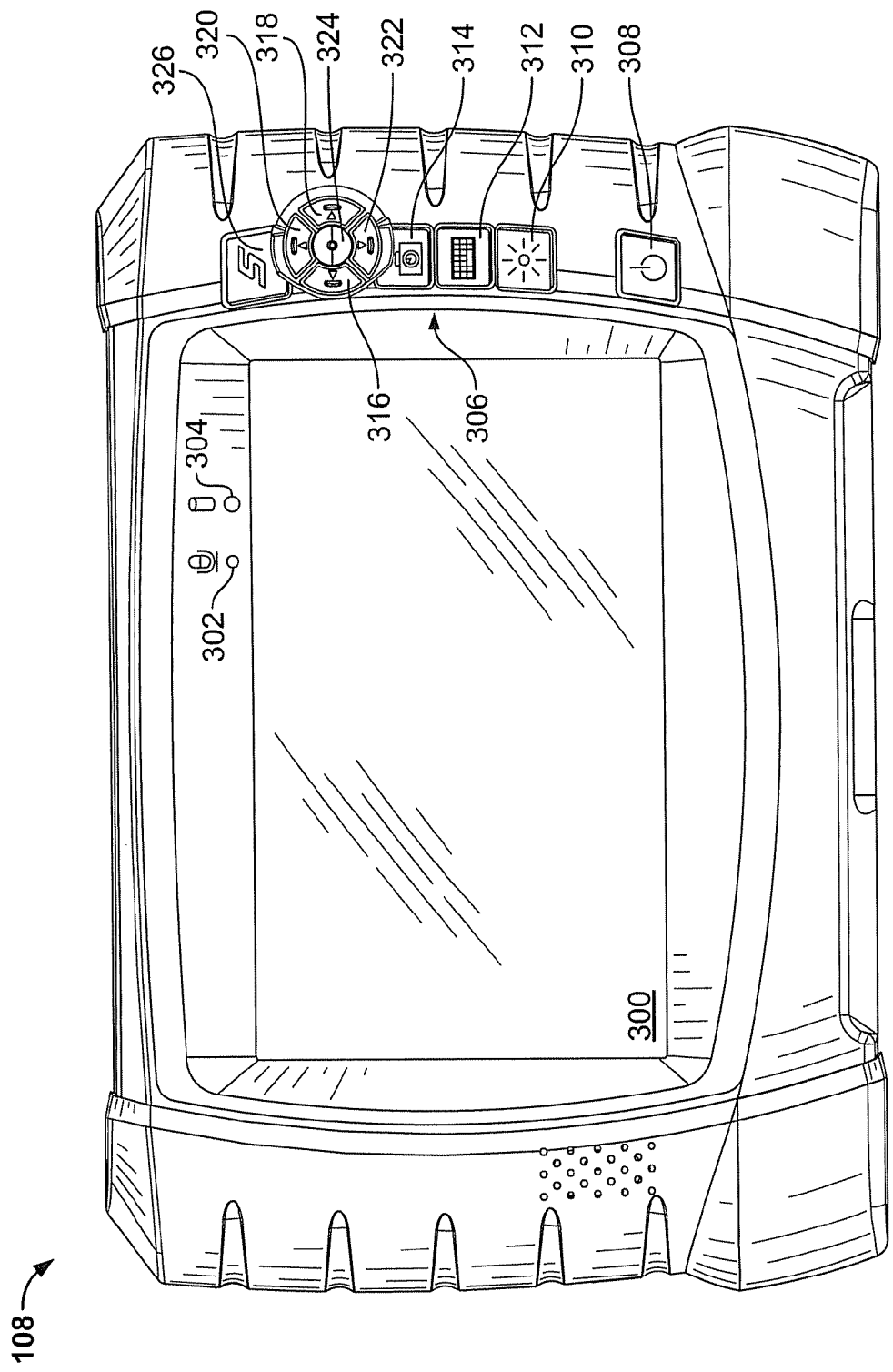
FIG. 14 illustrates an example display device.

FIG. 14 illustrates an example embodiment of display device 108, and in particular, that display device 108 includes display 300, a microphone 302 for receiving audible data (e.g., voice data generated by a user of display device 108 or sounds generated by a motor vehicle), a status indicator 304 (e.g., a light emitting diode (LED)), and user controls 306. The voice data may include voice commands for making a mode-selection from a menu displayed on display 300. A microphone symbol is located above microphone 302 and a data storage device symbol is located above status indicator 304.

Display 300 may comprise a liquid crystal display (LCD), a plasma display, or some other type of display. Display 300 is operable to visually present (e.g., display) data to a user. Display 300 may visually present data using numbers, letters, punctuation marks, pictures, graphs, waveforms, or some other visually presentable form of data. The data visually presentable and/or presented at display 300 may include locally-acquired data (LAD), such as menu data 216 and a cursor that can be moved between menu items of menu data 216. The data visually presentable and/or presented at display 300 may include remotely-acquired data (RAD), such as data acquired via wireless transceiver 202 or wired interface 206. The RAD may include data for generating present-time and historical waveforms for input signals received at one or more input channels of DAQ device 104.

Display 300 may comprise a touch screen that can detect the presence and location of a touch within its display area. The various menu items of a displayed menu may be selected via the touch screen. While operating to display waveforms, the touch screen may include one or more areas designated for tagging an input signal to be displayed as a historical waveform. Each of the designated areas may correspond to input signals received at a respective input signal of DAQ device 104.

User controls 306 are operable to enter a user input. User controls 306 may be arranged in various ways. In that regard, user controls 306 may be arranged to include a keypad, rotary switches, push buttons, or some other means to enter a user input. In the example embodiment illustrated in FIG. 14, user controls 306 include a power button 308, a brightness button 310, a keyboard button 312, a camera button 314, a cursor left button 316, a cursor right button 318, a cursor up button 320, a cursor down button 322, a menu item selection button 324, and a quick access button 326. Table 2 lists example user inputs that can be entered by pushing a user control of user controls 306. Other examples of user controls 306 and other examples of the user inputs are also possible.

TABLE 2

| User Control | Example User inputs |
| --- | --- |
| Power button 308 | Turn display device 108 power on or off. |
| Brightness button 310 | Increase or decrease a brightness of display 300. Display a brightness menu at display 300. |
| Keyboard button 312 | Display keyboard at display 300. Remove keyboard being displayed at display 300. |
| Camera button 314 | Activate camera shutter to capture an image |
| Cursor left button 316 | Move a cursor, displayed at display 300, to the left |
| Cursor right button 318 | Move a cursor, displayed at display 300, to the right |
| Cursor up button 320 | Move a cursor, displayed at display 300, upward |
| Cursor down button 322 | Move a cursor, displayed at display 300, downward |
| Menu item selection button 324 | Select a menu item from displayed menu data 216. |
| Quick access button 326 | Select a function that pertains to a current operating mode of display device 108 (e.g., tag an input signal being displayed as a waveform). |

Figure 15:
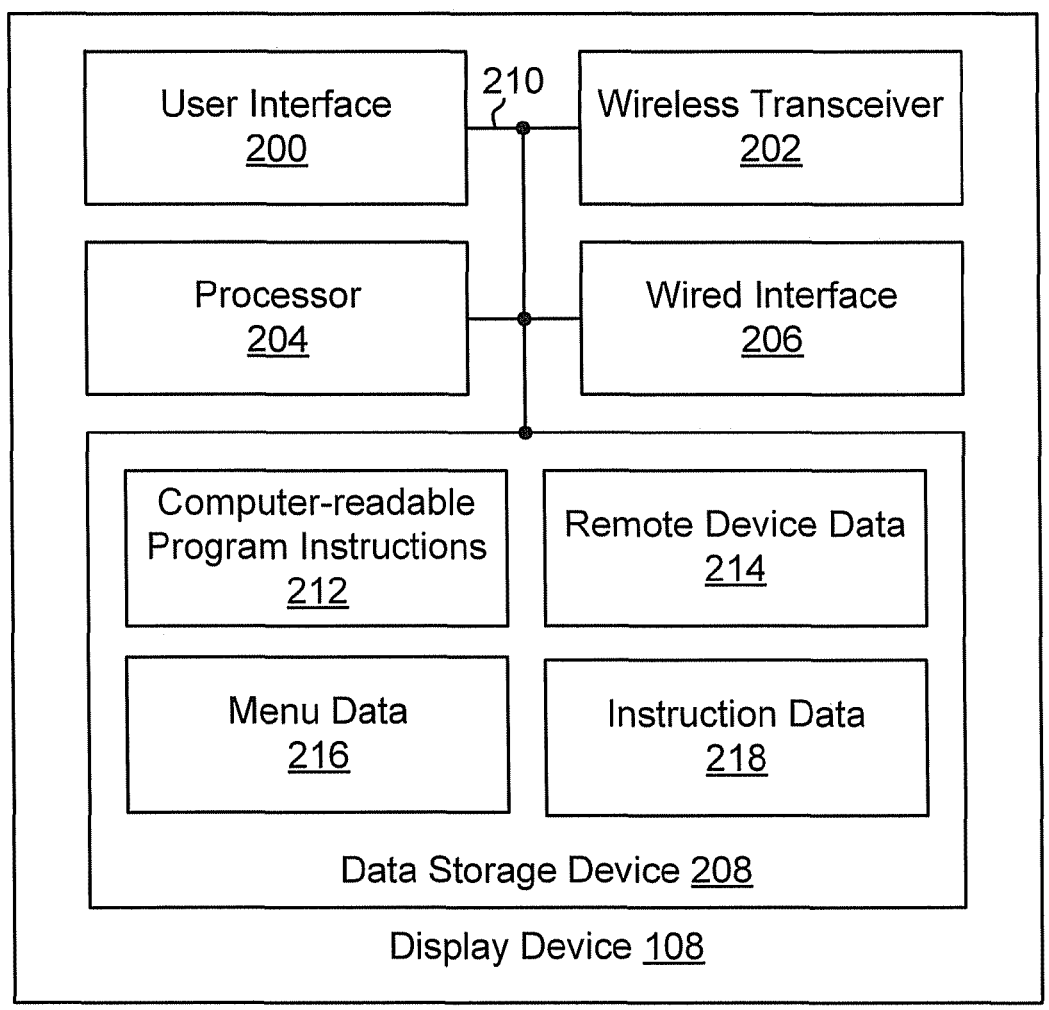
FIG. 15 is a block diagram of the example display device illustrated in FIG. 14.

Next, FIG. 15 is a block diagram of display device 108. As illustrated in FIG. 15, display device 108 includes a user interface 200, a wireless transceiver 202, a processor 204, a wired interface 206, and a data storage device 208, all of which may be linked together via a system bus, network, or other connection mechanism 210.

User interface 200 is operable to present data to a user and to enter user inputs. User interface 200 may include display 300. Display 300 is operable to visually present data, such as data transmitted to wireless transceiver 202 from a remote device (e.g., DAQ device 104 or vehicle scanner 106), data that is transmitted to wired interface 206, data stored at data storage device 208 (e.g., menu data 216), or some other type of data. Display 300 may simultaneously display data that is transmitted to display device 108 from DAQ device 104 and data that is transmitted to display device 108 from vehicle scanner 106.

Wireless transceiver 202 comprises a wireless transceiver that is operable to carry out communications via wireless network 110. Wireless transceiver 202 may carry out communications with one or more remote devices, such as one or more of DAQ device 104, vehicle scanner 106, and some other device (other than display device 108) that is operating to communicate via wireless network 110. As an example, wireless transceiver 202 may comprise a BLUETOOTH® transceiver, a WI-FI® transceiver, or some other type of wireless transceiver.

In accordance with an embodiment in which DAQ device 104, vehicle scanner 106, and display device 108 each include a single wireless transceiver (e.g., a BLUETOOTH® transceiver), one of the devices, such as display device 108, can operate as a master (e.g., a controller), and the other devices, such as DAQ device 104 and vehicle scanner 106, can operate as slaves to the master. DAQ device 104, vehicle scanner 106, and display device 108 may transmit communications via wireless network 110 using a time-division duplex arrangement and synchronized to a clock signal of the master.

Wireless transceiver 202 is not limited to a single wireless transceiver. For example, wireless transceiver 202 may comprise a BLUETOOTH® transceiver and a WI-FI® transceiver. In accordance with such an example, the BLUETOOTH® transceiver may communicate with DAQ device 104 and/or vehicle scanner 106 via a BLUETOOTH® network of wireless network 110, and the WI-FI® transceiver may communicate with DAQ device 104 and/or vehicle scanner 106 via a WI-FI® network of wireless network 110.

Under a given implementation of a BLUETOOTH® network, up to seven devices may actively exchange data with a master of the BLUETOOTH® network. When one of the seven devices transitions from being an active device to a parked device, another parked device can transition from being a parked device to an active device that can exchange data with the master. If display device 108 is operating as the master of the BLUETOOTH® network, then up to seven remote devices may actively exchange data with display device 108. As an example, the remote devices exchanging data with display device 108 may include DAQ device 104 and vehicle scanner 106. As another example, the remote devices exchanging data with display device 108 may include DAQ device 104, vehicle scanner 106, and another data acquisition device (arranged similar to DAQ device 104). Other examples of remote devices that can operate as one of seven devices actively exchanging data with display device 108 when display device 108 is operating as the master are also possible.

Wired interface 206 may include one or more ports. Each port of wired interface 206 provides an interface to display device 108 and to one or more circuits. In one respect, the one or more circuits may comprise electrical circuits, such as the electrical circuits of a Universal Serial Bus (USB) cable or the electrical circuits of an Ethernet cable (e.g., a CAT 5 cable). In another respect, the one or more circuits may comprise optical fibers that are operable to carry optical signals. Other examples of the one or more circuits are also possible.

Processor 204 may comprise one or more general purpose processors (e.g., INTEL® microprocessors) and/or one or more special purpose processors (e.g., digital signal processors). Processor 204 may execute computer-readable program instructions (CRPI) 212 that are contained in computer-readable data storage device 208.

Data storage device 208 may comprise a computer-readable storage medium readable by processor 204. The computer-readable storage medium may comprise volatile and/or non-volatile storage components, such as optical, magnetic, organic or other memory or disc storage, which can be integrated in whole or in part with processor 204. Data storage device 208 may contain various data including, but not limited to, CRPI 212, remote device data 214, menu data 216, and instruction data 218.

Remote device data 214 may include data associated with a device that is arranged to communicate with display device 108 via wireless network 110. For example, remote device data 214 may include data associated with DAQ device 104, such as a radio identifier and password associated with DAQ device 104. The data associated with DAQ device 104 may be received at display device 108, for storing as remote device data 214, during a pairing process carried out between display device 108 and DAQ device 104. The pairing process between DAQ device 104 and display device 108 may include DAQ device 104 providing display device 108 with the data associated with DAQ device 104 and display device 108 providing DAQ device 104 with data associated with display device 108. After carrying out the paring process with DAQ device 104, display device 108 may use the remote device data 214 when establishing communication network 110 with DAQ device 104.

Instruction data 218 may comprise various data. As an example, instruction data 218 may comprise data that illustrates how to connect DAQ device 104 and/or vehicle scanner 106 to device-under-service 102. As another example, instruction data 218 may comprise diagnostic information for diagnosing device-under-service 102. For instance, in accordance with an example embodiment in which device-under-service 102 comprises an automobile, the diagnostic information may comprise diagnostic flow charts for diagnosing an electrical system on the automobile. The diagnostic flow charts can provide different paths to follow based on measurement data display device 108 obtains from DAQ device 104 and/or vehicle scanner 106.

Menu data 216 comprises data that can be visually presented via display 300 as a menu. Each respective menu may comprise one or more menu items that is/are selectable by a user. Selection of a menu item can cause display 300 to display instruction data 218. Additionally or alternatively, selection of a menu item can cause wireless transceiver 202 to transmit instruction data 218 to a remote device (e.g., DAQ device 104 or vehicle scanner 106) as payload of a message or to transmit a mode-selection command to the remote device.

CRPI 212 may comprise program instructions that are executable as an operating system that provides for direct control and management of hardware components (e.g., processor 204 and data storage device 208) of display device 108. The operating system can manage execution of other program instructions within CRPI 212. As an example, the operating system may comprise the WINDOWS XP® Embedded (XPe) operating system available from Microsoft Corporation, Redmond, Wash., United States. Other examples of the operating system are also possible.

As another example, CRPI 212 may comprise program instructions that are executable by processor 204 to cause display 300 to display menu data 216 or instruction data 218. Displaying menu data 216 may include displaying a list of operating modes of DAQ device 104 or a list of operating modes of vehicle scanner 106.

As another example, CRPI 212 may comprise program instructions that are executable by processor 204 to identify a desired mode of a remote device (e.g., DAQ device 104 or vehicle scanner 106) selected from a list of operating modes displayed on display 300. The list of operating modes may be stored within menu data 216. User interface 200 may be used to select the desired mode from the displayed list of operating modes while the remote device is operating in a mode different than the desired mode.

As another example, CRPI 212 may comprise program instructions that are executable by processor 204 to generate a mode-selection command and to cause wireless transceiver 202 to transmit the mode-selection command via wireless network 110. Those program instructions may be executed in response to processor 204 identifying a desired mode selected from the displayed list of operating modes. The mode-selection can include data that indicates DAQ device should operate in its oscilloscope mode and that the DAQ device should transmit data for displaying waveform is on display 300.

As another example, CRPI 212 may comprise program instructions that are executable to cause data storage device 208 to store input data for generating a waveform. The input data for generating a waveform may comprise digital data that is generated by input signal processing element 914 in response to an analog input signal received from one of the input leads 912, and transmitted to display device 108 via wireless network 110. The input data contained in data storage 208 may comprise input data similar to input data 922 contained in DAQ device 104.

As another example, CRPI 212 may comprise program instruction (referred to herein as PI-212-F) that are executable to tag input signals as input signals to be displayed as historical waveforms. Processor 204 may execute PI-212-F in response to use of user control 306 while a present-time waveform is being displayed on display 300. Each input channel of DAQ device 104 may be associated with a particular user control or area of display 300 that can be pushed to cause a present-time waveform for that input channel to be tagged as a historical waveform for that input channel.

As another example, CRPI 212 may comprise program instructions (referred to herein as PI-212-G) that are executable to refresh display 300 and/or to determine which waveform(s) should be displayed on display 300 each time it is refreshed. As an example, execution of PI-212-G may cause processor 204 to determine that a particular input signal for a first input channel of DAQ device 104 is to be displayed as a historical waveform and to cause display 300 to display the particular input signal as a historical waveform when the display is refreshed. Causing display 300 to display a particular input signal may include retrieving from data storage device 208 data tagged as a historical waveform for a particular input channel. Execution of PI-212-G to refresh display 300 may include causing display 300 to simultaneously display a present-time waveform and historical waveform for the first input channel. Moreover, PI-212-G may be executed to refresh display 300 to simultaneously display historical and present-time waveforms for multiple input channel of DAQ device 104.

V. Conclusion

Example embodiments have been described above. Those skilled in the art will understand that changes and modifications may be made to the described embodiments without departing from the true scope and spirit of the present invention, which is defined by the claims.

I claim:

1. A method comprising:
   receiving a first input signal at a first input channel of a data acquisition (DAQ) device;
   after receiving the first input signal at the first input channel, refreshing a display to visually present the first input signal at the first input channel as a first present-time waveform for the first input channel;
   receiving, while the first input signal at the first input channel is visually presented as the first present-time waveform for the first input channel, a first user input at a user interface and responsively tagging the first input signal at the first input channel as a first historical waveform for the first input channel; and
   after receiving the first input signal at the first input channel, receiving a second input signal at the first input channel and responsively refreshing the display to visually present, simultaneously, the second input signal at the first input channel as a second present-time waveform for the first input channel and the first input signal at the first input channel as the first historical waveform for the first input channel.

2. The method of claim 1,
   wherein the display uses a first color to visually present the first input signal as the first present-time waveform,
   wherein the display uses a second color to visually present the first input signal as the first historical waveform, wherein the display uses the first color to visually present the second input signal as the second present-time waveform, and
wherein the first color and second color are different colors.

3. The method of claim 1,
wherein the display uses solid lines to visually present the first input signal as the first present-time waveform,
wherein the display uses dashed lines to visually present the first input signal as the first historical waveform, and
wherein the display uses solid lines to visually present the second input signal as the second present-time waveform.

4. The method of claim 1, further comprising
disconnecting a first end of an input lead from a signal acquisition point, wherein a second end of the input lead is connected to the first input channel, and wherein the first input channel received the first input signal and the second input signal from the signal acquisition point via the input lead; and
in response to disconnecting the first end of the input lead, refreshing the display to visually present, simultaneously, the first input signal at the first input channel as the first historical waveform and a horizontal line to represent that the first end of the input lead is disconnected.

5. The method of claim 1, further comprising:
receiving, while the display is visually presenting the first input signal at the first input channel as the first historical waveform, a second user input at the user interface,
wherein, while refreshing the display for the first time after receiving the second user input, the display is refreshed so that the display is not visually presenting the first historical waveform.

6. The method of claim 1, wherein receiving the first user input at the user interface comprises a processor within the DAQ device detecting that a selector input on the DAQ device has been pushed or pushed and released.

7. The method of claim 1, further comprising:
transmitting, by a wireless transceiver of the DAQ device to a wireless transceiver of a remote display device including the display, data packets including data for visually presenting the first present-time waveform and the first historical waveform.

8. The method of claim 1, further comprising:
repeatedly receiving additional input signals at the first input channel, wherein the first input channel receives the additional input signals after receiving the second input signal at the first input channel, and wherein receiving the additional input signals comprises receiving a third input signal at the first input channel; and
in response to receiving the third input signal at the first input channel, refreshing the display to visually present, simultaneously, the first input signal at the first input channel as the first historical waveform for the first input channel and the third input signal at the first input channel as a third present-time waveform for the first input channel.

9. The method of claim 8, further comprising:
receiving, while the display visually presents, simultaneously, the first input signal at the first input channel as the first historical waveform and the third input signal at the first input channel as the third present-time waveform, a second user input at the user interface and responsively tagging the third input signal at the first input channel as a second historical waveform for the first input channel, wherein repeatedly receiving the additional input signals further comprises, after receiving the third input signal at the first input channel, receiving a fourth input signal at the first input channel, and
after receiving the fourth input signal at the first input channel, refreshing the display to visually present, simultaneously, the third input signal at the first input channel as the second historical waveform and the fourth input signal at the first input channel as a fourth present-time waveform for the first input channel.

10. The method of claim 1, further comprising:
receiving input signals at a second input channel of the DAQ device, wherein receiving the input signals at the second input channel comprises receiving a first input signal at the second input channel and thereafter receiving a second input signal at the second input channel, and wherein the display is operable to visually present input signals received at the second input channel as respective present-time waveforms for the second input channel;
after receiving the first input signal at the second input channel, refreshing the display to visually present the first input signal at the second input channel as a first present-time waveform for the second input channel;
receiving, while the first input signal at the second input channel is visually presented as the first present-time waveform for the second input channel, a second user input at the user interface and responsively tagging the first input signal at the second input channel as a first historical waveform for the second input channel; and
after receiving the second input signal at the second input channel, refreshing the display to visually present, simultaneously, the first input signal at the second input channel as the first historical waveform for the second input channel and the second input signal at the second input channel as a second present-time waveform for the second input channel.

11. The method of claim 10,
wherein refreshing the display to visually present, simultaneously, the first input signal at the first input channel as the first historical waveform and the second input signal at the first input channel as the second present-time waveform for the first input channel occurs while refreshing the display to visually present, simultaneously, the first input signal at the second input channel as the first historical waveform for the second input channel and the second input signal at the second input channel as a second present-time waveform for the second input channel, and
wherein the display simultaneously visually presents the first input signal at the first input channel as the first historical waveform, the second input signal at the first input channel as the second present-time waveform for the first input channel, the first input signal at the second input channel as the first historical waveform for the second input channel, and the second input signal at the second input channel as a second present-time waveform for the second input channel.

12. A system comprising:
a first input channel that receives input signals, wherein the input signals received at the first input channel comprise a first input signal at the first input channel and a second input signal at the first input channel, wherein the first input signal at the first input channel is at the first input channel prior to the second input signal at the first input channel;
a display that is operable to visually present each input signal at the first input channel as a respective present-time waveform for the first input channel, wherein, after receipt of the first input signal at the first input channel, the display is refreshed to visually present the first input signal at the first input channel as a first present-time waveform for the first input channel;

a processor;

a user interface that is operable to receive user inputs; and a data storage device containing computer-readable program instructions that are executable by the processor to tag input signals as historical waveforms, wherein, in response to the user interface receiving a first user input while the first input signal at the first input channel is visually presented as the first present-time waveform for the first input channel, the processor executes the computer-readable program instructions to tag the first input signal at the first input channel as a first historical waveform for the first input channel, and wherein, after receipt of the second input signal at the first input channel, the display is refreshed to visually present, simultaneously, the first input signal at the first input channel as the first historical waveform for the first input channel and the second input signal at the first input channel as a second present-time waveform for the first input channel.

13. The system of claim 12, wherein the first input signal at the first input channel and the second input signal at the first input channel are received from a common input signal acquisition point.

14. The system of claim 12, wherein the first input signal at the first input channel and the second input signal at the first input channel are received from different input signal acquisition points.

15. The system of claim 12, wherein the input signals received at the first input channel include a third input signal at the first input channel, and wherein, in response to receipt of the third input signal at the first input channel, the display is refreshed to visually present, simultaneously, the first input signal at the first input channel as the first historical waveform for the first input channel and the third input signal at the first input channel as a third present-time waveform for the first input channel.

16. The system of claim 12, further comprising:

a data acquisition device, wherein the data acquisition device includes the first input channel, the display, the processor, the user interface, and the data storage device.

17. The system of claim 12, further comprising:

a second input channel that receives input signals, wherein the input signals received at the second input channel include a first input signal at the second input channel and a second input signal at the second input channel, wherein the first input signal at the second input channel is at the second input channel prior to the second input signal at the second input channel, wherein the display is operable to visually present each input signal at the second input channel as a respective present-time waveform for the second input channel, and wherein, after receipt of the first input signal at the second input channel, the display is refreshed to visually present the first input signal at the second input channel as a first present-time waveform for the second input channel.

18. The system of claim 17, wherein, after receipt of the second input signal at the second input channel, the display is refreshed to visually present, simultaneously, the second input signal at the second input channel as a second present-time waveform for the second input channel, and the second input channel receives a third input signal at the second input channel, wherein the processor executes the computer-readable program instructions to tag the second input signal at the second input channel in response to the user interface receiving a second user input while the second input signal at the second input channel is visually presented as the second present-time waveform for the second input channel, and wherein, after receipt of the third input signal at the second input channel, the display is refreshed to visually present, simultaneously, the second input signal at the second input channel as a first historical waveform for the second input channel and the third input signal at the second input channel as a third present-time waveform for the second input channel.

19. The system of claim 12, further comprising:

a data acquisition device; and a display device, wherein the data acquisition device includes the first input channel and a first wireless transceiver, wherein the display device includes the display, the processor, the user interface, the data storage device, and a second wireless transceiver, and wherein the first wireless transceiver transmits to the second wireless transceiver data packets including data for visually presenting the first present-time waveform and the first historical waveform.

20. The system of claim 19, wherein the data acquisition device includes a selector device to select a remote-control state in which a data acquisition mode performed by the data acquisition device is selected by the display device.

21. A data acquisition device comprising:

an input element including at least one input channel to receive input signals, wherein the at least one input channel includes a first input channel, and wherein the input signals include a first input signal received at the first input channel and a second input signal received after receipt of the first input signal;

a display to visually present the first input signal as a first present-time waveform for the first input channel;

a processor;

a user interface to receive user inputs; and a data storage device storing computer-readable program instructions (CRPI), wherein the CRPI include program instructions executable by the processor to tag, in response to a user input received by the user interface while the display visually presents the first input signal as the first present-time waveform, the first input signal as a first historical waveform, and wherein the CRPI include program instructions executable by the processor to refresh the display to visually present, simultaneously, the first input signal as the first historical waveform and the second input signal as a second present-time waveform.

22. The data acquisition device of claim 21, wherein the at least one input channel includes a second input channel separate from the first input channel, and wherein receipt of the second input signal occurs at the first input channel or the second input channel.

23. A display device comprising:

a wireless transceiver to receive, from a wireless network, data representing input signals received by an input channel of a data acquisition device, wherein the received data includes data representing a first input signal received at the input channel and data representing a second input signal received by the data acquisition device after receipt of the first input signal;
a display to visually present the data representing the first input signal as a first present-time waveform for the input channel;
a processor;
a user interface to receive user inputs; and
a data storage device storing computer-readable program instructions (CRPI),
wherein the CRPI include program instructions executable by the processor to tag, in response to a user input received by the user interface while the display visually presents the data representing the first input signal as the first present-time waveform, the first input signal as a first historical waveform, and
wherein the CRPI include program instructions executable by the processor to refresh the display to visually present, simultaneously, the data representing the first input signal as the first historical waveform and the data representing the second input signal as a second present-time waveform.

* * * * *